(12) United States Patent
An et al.

(10) Patent No.: US 11,953,949 B2
(45) Date of Patent: Apr. 9, 2024

(54) ELECTRONIC DEVICE COMPRISING DUAL DISPLAY

(71) Applicant: SAMSUNG ELECTRONICS CO., LTD., Suwon-si (KR)

(72) Inventors: Jungchul An, Suwon-si (KR); Seungki Choi, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 157 days.

(21) Appl. No.: 17/432,031

(22) PCT Filed: Feb. 10, 2020

(86) PCT No.: PCT/KR2020/001808
§ 371 (c)(1),
(2) Date: Aug. 18, 2021

(87) PCT Pub. No.: WO2020/171447
PCT Pub. Date: Aug. 27, 2020

(65) Prior Publication Data
US 2022/0155826 A1 May 19, 2022

(30) Foreign Application Priority Data
Feb. 19, 2019 (KR) .......................... 10-2019-0019427

(51) Int. Cl.
*G06F 1/16* (2006.01)
*H04M 1/02* (2006.01)
(Continued)

(52) U.S. Cl.
CPC .......... *G06F 1/1681* (2013.01); *G06F 1/1618* (2013.01); *G06F 1/1647* (2013.01);
(Continued)

(58) Field of Classification Search
None
See application file for complete search history.

(56) References Cited

U.S. PATENT DOCUMENTS 9,348,450 B1 * 5/2016 Kim ..................... H04M 1/0268
9,411,364 B2 8/2016 Chuang et al.
(Continued)

FOREIGN PATENT DOCUMENTS

EP     3 346 354      7/2018
JP     2014-165703    9/2014
(Continued)

OTHER PUBLICATIONS

International Search Report for PCT/KR2020/001808 dated May 21, 2020, 5 pages.
(Continued)

*Primary Examiner* — Anthony Q Edwards
*Assistant Examiner* — Rashen E Morrison
(74) *Attorney, Agent, or Firm* — Nixon & Vanderhye P.C.

(57) ABSTRACT

According to various embodiments, an electronic device may comprise: a housing comprising a first housing and a second housing. The first housing may comprise: a hinge module including a hinge; a first plate connected to the hinge module; a second plate facing a direction opposite the first plate; and a first side frame surrounding a first space between the first plate and the second plate. The second housing may comprise: a third plate connected to the hinge module; a fourth plate facing a direction opposite the third plate; and a second side frame surrounding a second space between the third plate and the fourth plate. The first housing and the second housing may be configured to fold or unfold with regard to each other using the hinge module. In addition, the electronic device may comprise: a printed circuit board disposed in the second space; a first display supported by the
(Continued)

first plate and the third plate; a battery disposed between the third plate and the fourth plate in the second space; and a second display disposed between the battery and the fourth plate and visible from the outside through at least a part of the fourth plate. At least a part of the second display may be disposed to face the battery.

15 Claims, 13 Drawing Sheets

(51) Int. Cl.
      *H05K 1/18*       (2006.01)
      *H05K 5/02*       (2006.01)

(52) U.S. Cl.
      CPC ........ *G06F 1/1652* (2013.01); *H04M 1/0268* (2013.01); *H05K 1/189* (2013.01); *H05K 5/0226* (2013.01)

(56) References Cited

U.S. PATENT DOCUMENTS

| | | | |
|---|---|---|---|
| 9,625,947 | B2 | 4/2017 | Lee et al. |
| 9,736,282 | B2 | 8/2017 | Lee et al. |
| 11,003,222 | B2 | 5/2021 | Moon et al. |
| 11,416,033 | B2 * | 8/2022 | Jia ............................ G09F 9/301 |
| 2015/0363033 | A1 | 12/2015 | Okabe |
| 2016/0048165 | A1 | 2/2016 | Becze |
| 2016/0255182 | A1 | 9/2016 | Lee et al. |
| 2017/0206049 | A1 | 7/2017 | Choi et al. |
| 2018/0275725 | A1 | 9/2018 | Lin et al. |
| 2018/0324964 | A1 * | 11/2018 | Yoo ....................... H01Q 1/2266 |
| 2019/0121396 | A1 | 4/2019 | Ha et al. |
| 2020/0221587 | A1 | 7/2020 | An |
| 2020/0225711 | A1 * | 7/2020 | Pelissier ............... G06F 1/1624 |

FOREIGN PATENT DOCUMENTS

| | | |
|---|---|---|
| KR | 10-2016-0049235 | 5/2016 |
| KR | 10-2016-0105227 | 9/2016 |
| KR | 10-2018-0001015 | 1/2018 |
| KR | 10-2020-0086505 | 7/2020 |

OTHER PUBLICATIONS

Written Opinion of the ISA for PCT/KR2020/001808 dated May 21, 2020, 5 pages.
Extended Search Report and Written Opinion dated Feb. 16, 2022 in counterpart European Patent Application No. 20760042.0.
Korean Office Action dated Dec. 21, 2023 for KR Application No. 10-2019-0019427.
European Office Action dated Sep. 5, 2023 for EP Application No. 20760042.0.
Chinese Office Action dated Nov. 3, 2023 for CN Application No. 202080029507.3.

* cited by examiner

ELECTRONIC DEVICE COMPRISING DUAL DISPLAY

CROSS-REFERENCE TO RELATED APPLICATIONS

This application is a national stage of International Application No. PCT/KR2020/001808 designating the United States, filed on Feb. 10, 2020 in the Korean Intellectual Property Receiving Office and claiming priority to Korean Patent Application No. 10-2019-0019427, filed on Feb. 19, 2019, in the Korean Intellectual Property Office, the disclosures of which are incorporated by reference herein in their entireties.

BACKGROUND

Field

The disclosure relates to an electronic device including a dual display.

Description of Related Art

As functional gaps among manufacturers are significantly reduced, electronic devices are gradually becoming slimmer to satisfy consumers' purchasing demands, and are also improved to increase the rigidity of electronic devices, strengthen their design aspects, and differentiate their functional features. Such electronic devices are being developed to have various shapes, departing from a uniform rectangular shape. For example, the electronic device may have a deformable structure that provides high portability and also provides a large-screen display in use. As one example of such deformable electronic devices, a foldable type electronic device are being released, which may require various arrangement configurations of the display for usability.

The foldable electronic device may include a hinge module, and first and second housings rotatably connected to the hinge module in opposite directions, respectively. The foldable electronic device may include a first display (e.g., a flexible display) disposed to cross the first housing, the hinge module, and the second housing in an unfolded state. Recently, the foldable electronic device may further include at least one second display (e.g., a sub-display) disposed through a rear surface of the first housing and/or the second housing opposite to a surface on which the flexible display is disposed. The second display is exposed to the outside in a folded state of the foldable electronic device to perform various functions such as a camera operation or visual provision of information according to an event occurrence.

When at least two displays are disposed on opposite surfaces of the foldable electronic device, the first display and the second display may be disposed to be supported through at least one support member extended from the first housing and/or the second housing into the internal space of the electronic device. In this case, because of the first and second displays arranged to overlap at least in part, the foldable electronic device may have an increased thickness causing degraded portability. In addition, if the first and second displays overlap without changing the volume of the foldable electronic device, a mounting space of the battery in the internal space may be reduced, and thus the capacity of the battery may decrease.

SUMMARY

Embodiments of the disclosure provide an electronic device including a dual display.

Embodiments of the disclosure provide an electronic device including a dual display having an efficient arrangement structure of the display without reduction in the capacity of a battery.

According to various example embodiments, an electronic device may include: a housing including a hinge module comprising a hinge, a first housing including a first plate connected to the hinge module, a second plate facing in an opposite direction to the first plate, and a first side frame surrounding a first space between the first plate and the second plate, and a second housing including a third plate connected to the hinge module, a fourth plate facing in the opposite direction to the third plate, and a second side frame surrounding a second space between the third plate and the fourth plate, wherein the first housing and the second housing are configured to be folded or unfolded with regard to each other using the hinge module; a printed circuit board disposed in the second space; a first display supported by the first plate and the third plate; a battery disposed between the third plate and the fourth plate in the second space; and a second display disposed between the battery and the fourth plate and visible from outside through at least a part of the fourth plate, wherein at least a part of the second display is disposed to face the battery.

An electronic device may include: a housing including a front plate, a rear plate facing in the opposite direction to the front plate, and a side frame surrounding a space between the front plate and the rear plate and including a support extending toward the space; a printed circuit board disposed in the space; a first display disposed between the support and the front plate and visible from outside through at least a part of the front plate; a battery disposed in the space; and a second display disposed between the battery and the rear plate and visible from outside through at least a part of the rear plate, wherein at least a part of the second display is disposed to face the battery.

According to various example embodiments of the disclosure, an efficient arrangement structure of a display is provided, so that a mounting space for an electronic component, such as a battery, disposed inside an electronic device is increased, or if a change in the volume of the electronic component is not considered, it can help to slim the electronic device.

BRIEF DESCRIPTION OF THE DRAWINGS

In connection with the description of the drawings, the same or similar reference numerals may be used for the same or similar components. The above and other aspects, features and advantages of certain embodiments of the present disclosure will be more apparent from the following detailed description, taken in conjunction with the accompanying drawings, in which.

DETAILED DESCRIPTION

Figure 1:
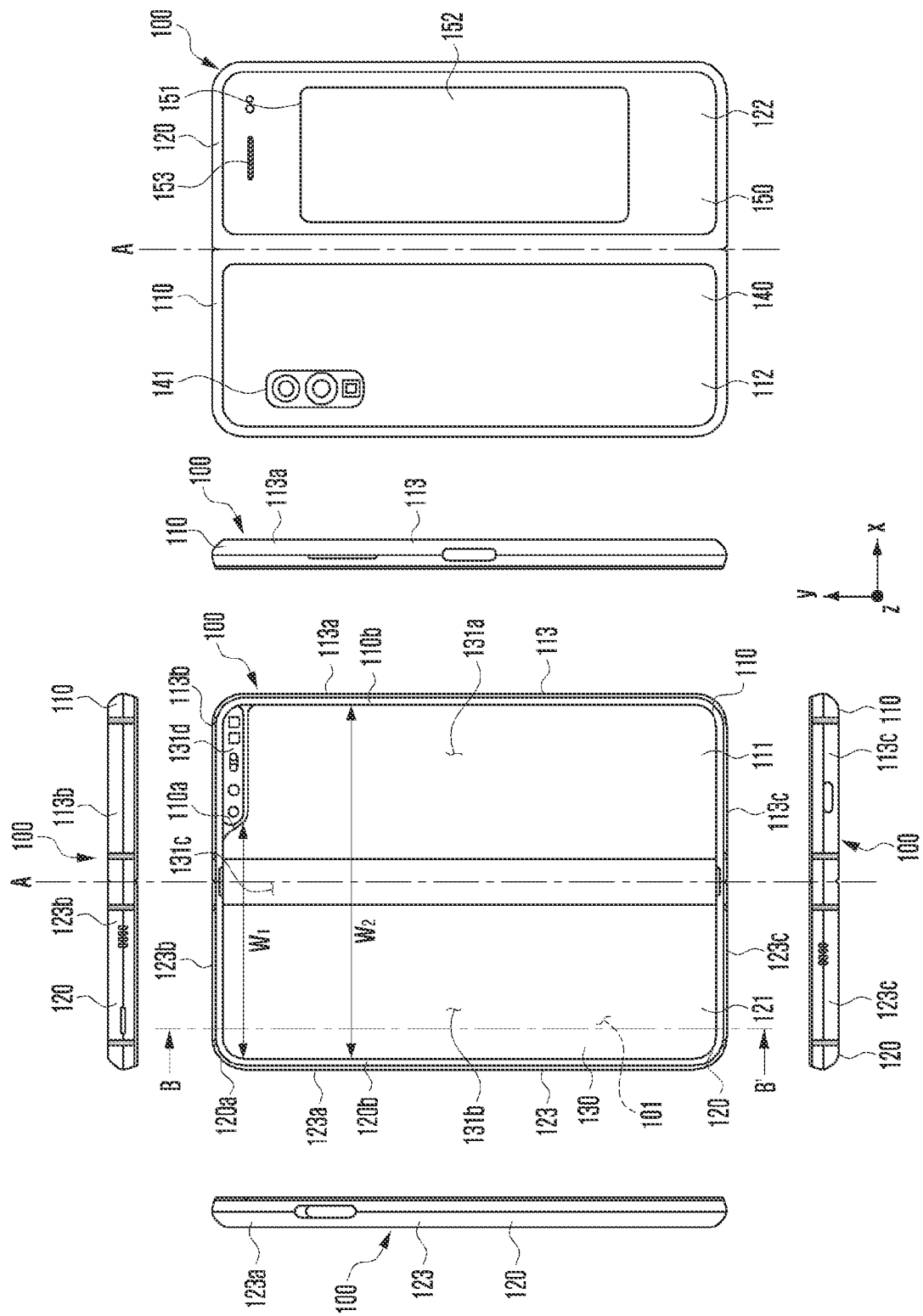
FIG. 1 is a diagram illustrating an example electronic device in an unfolded state according to various embodiments.
Figure 2:
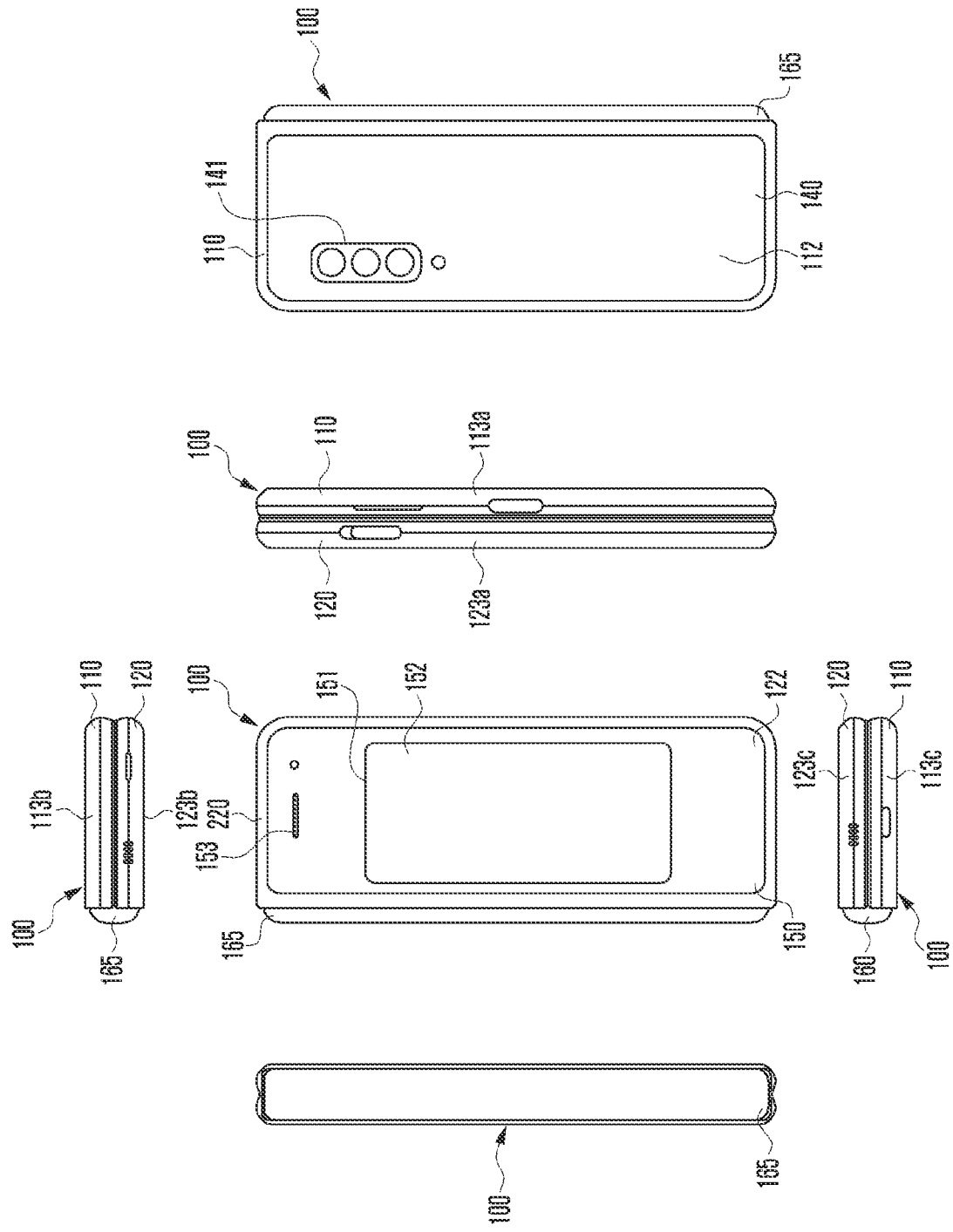
FIG. 2 is a diagram illustrating a folded state of the electronic device of FIG. 1 according to various embodiments.

FIG. 1 is a diagram illustrating an example electronic device in an unfolded state according to various embodiments. FIG. 2 is a diagram illustrating a folded state of the electronic device of FIG. 1 according to various embodiments.

Referring to FIG. 1, an electronic device 100 may include a pair of housing structures 110 and 120 rotatably coupled via a hinge structure (e.g., hinge structure 164 in FIG. 3) to be folded relative to each other, a hinge cover 165 covering the foldable portion of the pair of housing structures 110 and 120, and a display 130 (e.g., flexible display or foldable display) disposed in the space formed by the pair of housing structures 110 and 120. In the description, the surface on which the display 130 is disposed may be referred to as the front surface of the electronic device 100, and the opposite side of the front surface may be referred to as the rear surface of the electronic device 100. The surface surrounding the space between the front surface and the rear surface may be referred to as the side surface of the electronic device 100.

In an embodiment, the pair of housing structures 110 and 120 may include a first housing structure 110 including a sensor region 131d, a second housing structure 120, a first rear cover 140, and a second rear cover 150. The pair of housing structures 110 and 120 of the electronic device 100 are not limited to the shape or combination illustrated in FIGS. 1 and 2, but may be implemented in various shapes or combinations. For example, in an embodiment, the first housing structure 110 and the first rear cover 140 may be formed as a single body, and the second housing structure 120 and the second rear cover 150 may be formed as a single body.

In an embodiment, the first housing structure 110 and the second housing structure 120 may be disposed at both sides with respect to the folding axis (A) and may be substantially symmetrical with respect to the folding axis (A). In an embodiment, the angle or distance between the first housing structure 110 and the second housing structure 120 may vary depending upon whether the electronic device 100 is in the flat state or closed state, the folded state, or the intermediate state. In an embodiment, the first housing structure 110 includes the sensor region 131d where various sensors are disposed, but may have a symmetrical shape with the second housing structure 120 in other regions. In an embodiment, the sensor region 131d may be disposed in a specific region of the second housing structure 120 or may be replaced.

In an embodiment, during the flat state of the electronic device 100, the first housing structure 110 may be connected to the hinge structure (e.g., hinge structure 164 in FIG. 3), and may include a first surface 111 facing the front surface of the electronic device 100, a second surface 112 facing away from the first surface 111, and a first side member 113 enclosing at least a portion of the space between the first surface 111 and the second surface 112. In an embodiment, the first side member 113 may include a first side surface 113a disposed in parallel with the folding axis (A), a second side surface 113b extending from one end of the first side surface 113a in a direction perpendicular to the folding axis, and a third side surface 113c extending from the other end of the first side surface 113a in a direction perpendicular to the folding axis.

In an embodiment, during the flat state of the electronic device 100, the second housing structure 120 may be connected to the hinge structure (e.g., hinge structure 164 in FIG. 3), and may include a third surface 121 facing the front surface of the electronic device 100, a fourth surface 122 facing away from the third surface 121, and a second side member 123 enclosing at least a portion of the space between the third surface 121 and the fourth surface 122. In an embodiment, the second side member 123 may include a fourth side surface 123a disposed in parallel with the folding axis (A), a fifth side surface 123b extending from one end of the fourth side surface 123a in a direction perpendicular to the folding axis, and a sixth side surface 123c extending from the other end of the fourth side surface 123a in a direction perpendicular to the folding axis. In an embodiment, the third surface 121 may face the first surface 111 in the folded state.

In an embodiment, the electronic device 100 may include a recess 101 formed to accommodate the display 130 through a structural combination of the shapes of the first housing structure 110 and the second housing structure 120. The recess 101 may have substantially the same size as the display 130. In an embodiment, the recess 101 may have two or more different widths in a direction perpendicular to the folding axis (A) due to the sensor region 131d. For example, the recess 101 may have a first width (W1) between a first portion 120a of the second housing structure 120 parallel to the folding axis (A) and a first portion 110a of the first housing structure 110 formed at the edge of the sensor region 131d, and have a second width (W2) between a second portion 120b of the second housing structure 120 and a second portion 110b of the first housing structure 110 that does not correspond to the sensor region 113d and is parallel to the folding axis (A). Here, the second width (W2) may be wider than the first width (W1). In other words, the recess 101 may be formed to have the first width (W1) ranging from the first portion 110a of the first housing structure 110 to the first portion 120a of the second housing structure 120 (asymmetric shape), and the second width (W2) ranging from the second portion 110b of the first housing structure 110 to the second portion 120b of the second housing structure 120 (symmetric shape). In an embodiment, the first portion 110a and the second portion 110b of the first housing structure 110 may be located at different distances from the folding axis (A). The width of the recess 101 is not limited to the example shown above. In various embodiments, the recess 101 may have two or more different widths owing to the shape of the sensor region 113d or the asymmetry of the first housing structure 110 or the second housing structure 120. In an embodiment, at least a portion of the first housing structure 110 and the second housing structure 120 may be made of a metal or non-metal material having a rigidity value selected to support the display 130.

In an embodiment, the sensor region 131*d* may be formed to have a preset area near to one corner of the first housing structure 110. However, the arrangement, shape, or size of the sensor region 131*d* is not limited to the illustrated example. For example, in a certain embodiment, the sensor region 131*d* may be formed at another corner of the first housing structure 110 or in any region between the upper corner and the lower corner. In an embodiment, the sensor region 131*d* may be disposed at a portion of the second housing structure 120. In an embodiment, the sensor region 131*d* may be formed to extend between the first housing structure 110 and the second housing structure 120. In an embodiment, to perform various functions, the electronic device 100 may include components exposed to the front surface of the electronic device 100 through the sensor region 113*d* or through one or more openings provided in the sensor region 131*d*. The components may include, for example, at least one of a front camera, a receiver, a proximity sensor, an illuminance sensor, an iris recognition sensor, an ultrasonic sensor, or an indicator.

In an embodiment, the first rear cover 140 may be disposed on the second surface 112 of the first housing structure 110 and may have a substantially rectangular periphery. In an embodiment, at least a portion of the periphery may be wrapped by the first housing structure 110. Similarly, the second rear cover 150 may be disposed on the fourth surface 122 of the second housing structure 120, and at least a portion of the periphery thereof may be wrapped by the second housing structure 120.

In the illustrated embodiment, the first rear cover 140 and the second rear cover 150 may have a substantially symmetrical shape with respect to the folding axis (A). In an embodiment, the first rear cover 140 and the second rear cover 150 may have various different shapes. In an embodiment, the first rear cover 140 may be formed as a single body with the first housing structure 110, and the second rear cover 150 may be formed as a single body with the second housing structure 120.

In an embodiment, the first rear cover 140, the second rear cover 150, the first housing structure 110, and the second housing structure 120 may be combined with each other so as to provide a space where various components (e.g., printed circuit board, antenna module, sensor module, and battery) of the electronic device 100 can be arranged. In an embodiment, one or more components may be disposed on or visually exposed via the rear surface of the electronic device 100. For example, one or more components or sensors may be visually exposed through the first rear region 141 of the first rear cover 140. The sensors may include a proximity sensor, a rear camera, and/or a flash. In an embodiment, at least a portion of the sub-display 152 may be visually exposed through the second rear region 151 of the second rear cover 150.

The display 130 may be disposed on the space formed by the pair of housing structures 110 and 120. For example, the display 130 may be seated in the recess (e.g., recess 101 in FIG. 1) formed by the pair of housing structures 110 and 120, and may be disposed to substantially occupy most of the front surface of the electronic device 100. Hence, the front surface of the electronic device 100 may include the display 130, a portion (e.g., edge region) of the first housing structure 110 close to the display 130, and a portion (e.g. edge region) of the second housing structure 120 close to the display 130. In an embodiment, the rear surface of the electronic device 100 may include the first rear cover 140, a portion (e.g., edge region) of the first housing structure 110 close to the first rear cover 140, the second rear cover 150, and a portion (e.g. edge region) of the second housing structure 120 close to the second rear cover 150.

In an embodiment, the display 130 may refer to a display whose at least a portion may be deformed into a flat or curved surface. In an embodiment, the display 130 may include a folding region 131*c*, a first region 131*a* disposed on one side (e.g., right side of the folding region 131*c*) with respect to the folding region 131*c*, and a second region 131*b* disposed on the other side (e.g., left side of the folding region 131*c*). For example, the first region 131*a* may be disposed on the first surface 111 of the first housing structure 110, and the second region 131*b* may be disposed on the third surface 121 of the second housing structure 120. This demarcation of the display 130 is only an example, and the display 130 may be subdivided into plural regions (e.g., four or more regions) according to the structure or functionality. For example, in the embodiment of FIG. 1, the area of the display 130 may be subdivided with respect to the folding region 131*c* or the folding axis (A) extending parallel to the y-axis. However, in an embodiment, the area of the display 130 may be subdivided with respect to a different folding region (e.g., folding region parallel to the x-axis) or a different folding axis (e.g., folding axis parallel to the x-axis). The aforementioned subdivision of the display is only a physical demarcation based on the pair of housing structures 110 and 120 and the hinge structure (e.g., hinge structure 164 in FIG. 3), and the display 130 may substantially present one full screen through the pair of housing structures 110 and 120 and the hinge structure (e.g., hinge structure 164 in FIG. 3). In an embodiment, the first region 131*a* and the second region 131*b* may have a symmetrical shape with respect to the folding region 131*c*. Although the first region 131*a* may include a notch region (e.g., notch region 133 in FIG. 3) cut according to the presence of the sensor region 131*d*, it may have a symmetrical shape with the second region 131*b* in other portions. In other words, the first region 131*a* and the second region 131*b* may include portions with symmetrical shapes and portions with asymmetrical shapes.

Figure 3:
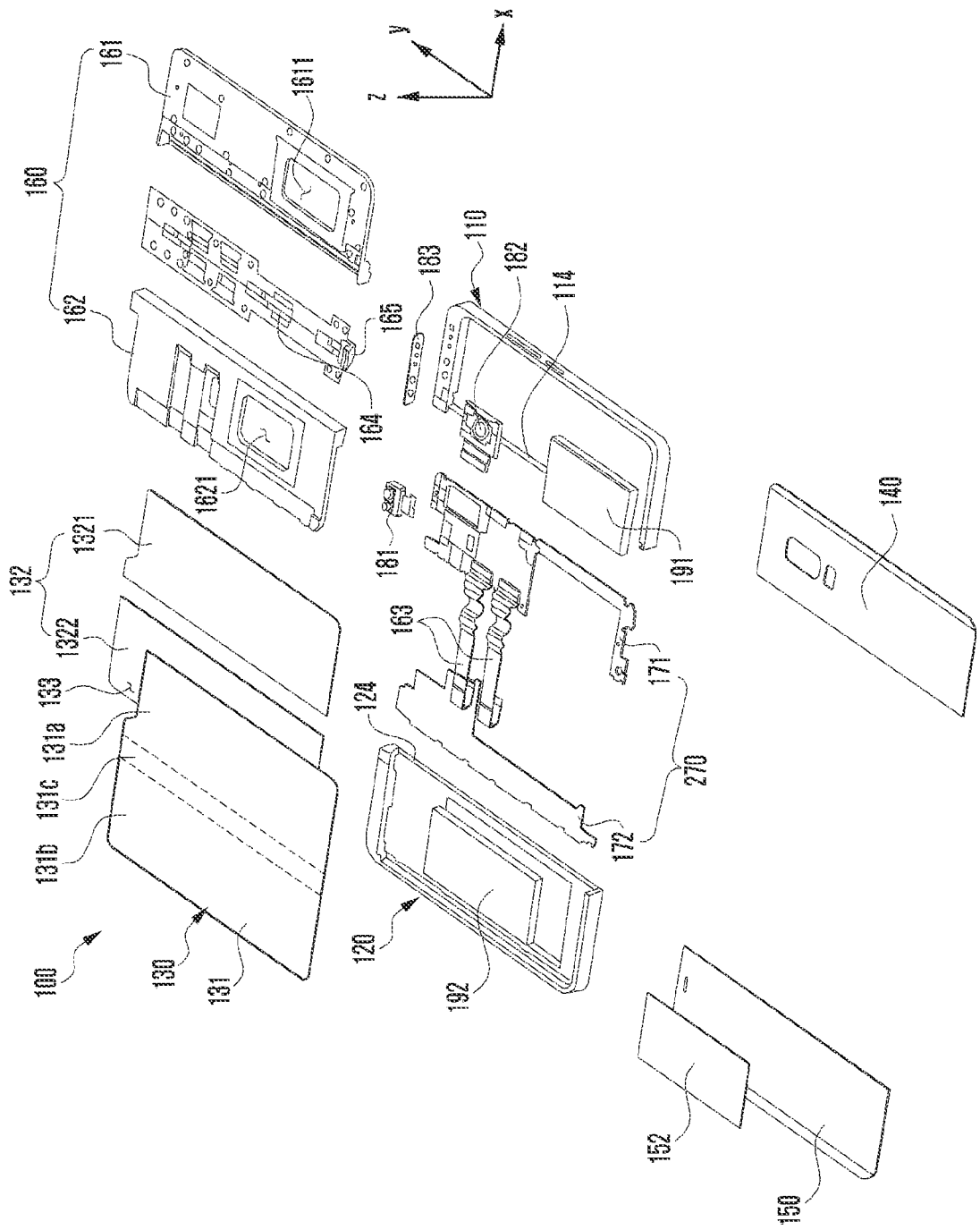
FIG. 3 is an exploded perspective view illustrating an electronic device according to various embodiments of the disclosure.

Referring to FIG. 2, the hinge cover 165 may be disposed between the first housing structure 110 and the second housing structure 120 so as to cover the internal components (e.g., hinge structure 164 in FIG. 3). In an embodiment, the hinge cover 165 may be covered by portions of the first housing structure 110 and the second housing structure 120 or be exposed to the outside according to the operating state (e.g., flat state or folded state) of the electronic device 100.

For example, when the electronic device 100 is in the flat state as illustrated in FIG. 1, the hinge cover 165 may be covered by the first housing structure 110 and the second housing structure 120 so as not to be exposed. When the electronic device 100 is in the folded state (e.g., completely folded state) as illustrated in FIG. 2, the hinge cover 165 may be exposed to the outside between the first housing structure 110 and the second housing structure 120. When the electronic device 100 is in the intermediate state where the first housing structure 110 and the second housing structure 120 make a certain angle, the hinge cover 165 may be partially exposed to the outside between the first housing structure 110 and the second housing structure 120. In this case, the exposed portion may be less than that for the fully folded state. In an embodiment, the hinge cover 165 may include a curved surface.

Next, a description is given of configurations of the first housing structure 110 and the second housing structure 120 and regions of the display 130 according to the operating state (e.g. flat state or folded state) of the electronic device 100.

In an embodiment, when the electronic device 100 is in the flat state (e.g., state of FIG. 1), the first housing structure 110 and the second housing structure 120 may make an angle of 180 degrees, and the first region 131a and the second region 131b of the display may be disposed to face in the same direction. In addition, the folding region 131c may be coplanar with the first region 131a and the second region 131b.

In an embodiment, when the electronic device 100 is in the folded state (e.g., state of FIG. 2), the first housing structure 110 and the second housing structure 120 may be disposed to face each other. The first region 131a and the second region 131b of the display 130 may face each other, making a narrow angle (e.g., between 0 degrees and 10 degrees). At least a portion of the folding region 131c may form a curved surface with a preset curvature.

In an embodiment, when the electronic device 100 is in the intermediate state, the first housing structure 110 and the second housing structure 120 may be disposed to make a certain angle. The first region 131a and the second region 131b of the display 130 may form an angle greater than that for the folded state and less than that for the flat state. At least a portion of the folding region 131c may form a curved surface with a preset curvature. This curvature may be less than that for the folded state.

FIG. 3 is an exploded perspective view of an electronic device according to an embodiment of the disclosure.

Referring to FIG. 3, in an embodiment, the electronic device 100 may include a display 130, a support member assembly 160, at least one printed circuit board 170, a first housing structure 110, a second housing structure 120, a first rear cover 140, and a second rear cover 150. In the description, the display 130 may be referred to as a display unit, display module, or display assembly.

The display 130 may include a display panel 131 (e.g., flexible display panel), and at least one plate 132 or layer on which the display panel 131 is seated. In an embodiment, the plate 132 may be disposed between the display panel 131 and the support member assembly 160. The display panel 131 may be disposed in at least a portion of one surface of the plate 132. The plate 132 may include a first plate 1321 and a second plate 1322 divided based on the hinge structure 164. The plate 132 may include at least one member that cannot be folded together when the first housing structure 110 and the second housing structure 120 rotate in a folded and/or unfolded state based on the hinge structure 164. The plate 132 may include at least one subsidiary material layer (e.g., graphite member) and/or a conductive plate (e.g., SUS sheet or Cu sheet) disposed at a rear surface of the display panel 131. In an embodiment, the plate 132 may be formed in a shape corresponding to the display panel 131. For example, a partial area of the first plate 1321 may be formed in a shape corresponding to the notch area 133 of the display panel 131. In an embodiment, the conductive plate may be integrally formed through a bendable connecting area.

The support member assembly 160 may include a first support member 161, a second support member 162, a hinge structure 164 disposed between the first support member 161 and the second support member 162, a hinge cover 165 to cover the hinge structure 164 when viewed from the outside, and a wiring member 163 (e.g., flexible printed circuit board (FPCB)) that crosses the first support member 161 and the second support member 162.

In an embodiment, the support member assembly 160 may be disposed between the plate 132 and at least one printed circuit board 170. For example, the first support member 161 may be disposed between the first region 131a of the display 130 and the first printed circuit board 171. The second support member 162 may be disposed between the second region 131b of the display 130 and the second printed circuit board 172.

In an embodiment, at least a portion of the wiring member 163 and the hinge structure 164 may be disposed within the support member assembly 160. The wiring member 163 may be disposed in a direction crossing the first support member 161 and the second support member 162 (e.g., x-axis direction). The wiring member 163 may be disposed in a direction (e.g., x-axis direction) perpendicular to the folding axis (e.g., y-axis or folding axis (A) in FIG. 2) of the folding region 131c.

The at least one printed circuit board 170 may include, as described above, the first printed circuit board 171 disposed on the side of the first support member 161, and the second printed circuit board 172 disposed on the side of the second support member 162. The first printed circuit board 171 and the second printed circuit board 172 may be disposed inside the space formed by the support member assembly 160, the first housing structure 110, the second housing structure 120, the first rear cover 140, and the second rear cover 150. Various components for implementing functions of the electronic device 100 may be mounted on the first printed circuit board 171 and the second printed circuit board 172.

In an embodiment, the first housing structure 110 may include a first printed circuit board 171, a battery 191, at least one sensor module 181, or at least one camera module 182 disposed in a space formed through the first support member 161. The first housing structure 110 may include a window glass 183 disposed to protect at least one sensor module 181 and at least one camera module 182 at a position corresponding to the notch area 133 of the display 130. In an embodiment, the second housing structure 120 may include a second printed circuit board 172 disposed in a space formed through the second support member 162. According to an embodiment, the first housing structure 110 and the first support member 161 may be integrally formed. According to an embodiment, the second housing structure 120 and the second support member 162 may also be integrally formed.

In an embodiment, the first housing structure 110 may include a first rotary support surface 114, and the second housing structure 120 may include a second rotary support surface 124 corresponding to the first rotary support surface 114. The first rotary support surface 114 and the second rotary support surface 124 may include a curved surface corresponding to the curved surface included in the hinge cover 165.

In an embodiment, when the electronic device 100 is in the flat state (e.g., state of FIG. 1), the first rotary support surface 114 and the second rotary support surface 124 may cover the hinge cover 165 so that the hinge cover 165 may be not or minimally exposed to the rear surface of the electronic device 100. When the electronic device 100 is in the folded state (e.g., state of FIG. 2), the first rotary support surface 114 and the second rotary support surface 124 may rotate along the curved surface included in the hinge cover 165 so that the hinge cover 165 may be maximally exposed to the rear surface of the electronic device 100.

Figure 4A:
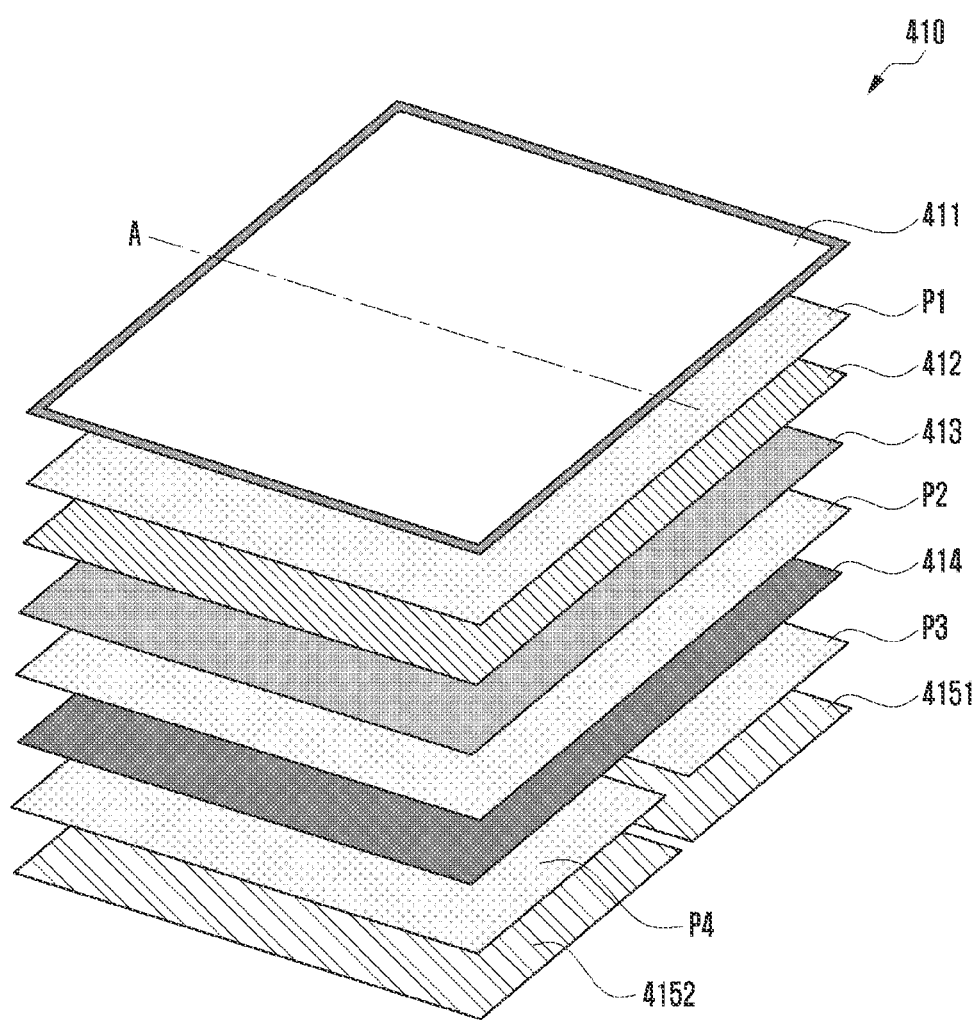
FIG. 4A is an exploded perspective view illustrating a stack structure of a first display according to various embodiments.

FIG. 4A is an exploded perspective view illustrating a stack structure of a first display 410 according to various embodiments.

The first display 410 of FIG. 4A may be similar at least in part to the display 130 of FIG. 3 or may further include other embodiments of the display.

Referring to FIG. 4A, in various embodiments, the first display 410 may include a window 411 (e.g., a polyimide (PI) film), and a polarizer (POL) 412 (e.g., a polarizing film), a display panel 413, a polymer member 414, and a pair of conductive members 4151 and 4152, which are sequentially disposed on the rear surface of the window 411. According to an embodiment, the window 411, the POL 412, the display panel 413, and/or the polymer member 414 are disposed to cross at least a part of a first surface (e.g., the first surface 111 in FIG. 1) of a first housing structure (e.g., the first housing structure 110 in FIG. 1) and a third surface (e.g., the third surface 121 in FIG. 1) of a second housing structure (e.g., the second housing structure 120 in FIG. 1), and a folding region facing a hinge structure (e.g., the hinge structure 164 in FIG. 3) may be configured to be foldable in response to a folded or unfolded operation of an electronic device (e.g., the electronic device 100 in FIG. 1). According to an embodiment, the pair of conductive members 4151 and 4152 have a non-bendable property, and thus may include, except for the folding region, a first conductive member 4151 disposed in a region facing the first housing structure 110 and a second conductive member 4152 disposed in a region facing the second housing structure 120. According to an embodiment, the POL 412, the display panel 413, the polymer member 414, and the pair of conductive members 4151 and 4152 may be attached to each other through adhesive members P1, P2, P3, and P4. For example, the adhesive members P1, P2, P3, and P4 may include at least one of various adhesives including various adhesive materials, including, for example and without limitation, an optical clear adhesive (OCA), a pressure sensitive adhesive (PSA), a heat-reactive adhesive, a general adhesive, or a double-sided tape.

According to various embodiments, a dark color (e.g., black) may be applied to the polymer member 414 to help display the background when the display is turned off. According to an embodiment, the polymer member 414 may absorb an impact from the outside of the electronic device and thereby act as a cushion for protecting the first display 410 from being damaged. According to an embodiment, the pair of conductive members 4151 and 4152 are metal plates, which may help to reinforce the rigidity of the electronic device, shield ambient noise, and dissipate heat emitted from surrounding components. According to an embodiment, the conductive members 4151 and 4152 may include at least one of copper (Cu), aluminum (Al), SUS, or a clad (e.g., a laminated stack of SUS and Al). According to an embodiment, the first conductive member 4151 and the second conductive member 4152 may be attached to the polymer member 414 through the adhesive members P3 and P4. In this case, the two adhesive members P3 and P4 may be disposed to have a greater gap than a gap between the two conductive members 4151 and 4152, so that when the two conductive members 4151 and 4152 are folded, mutual interference between the adhesive members P3 and P4 and their intrusion into the folding region can be reduced.

Figure 4B:
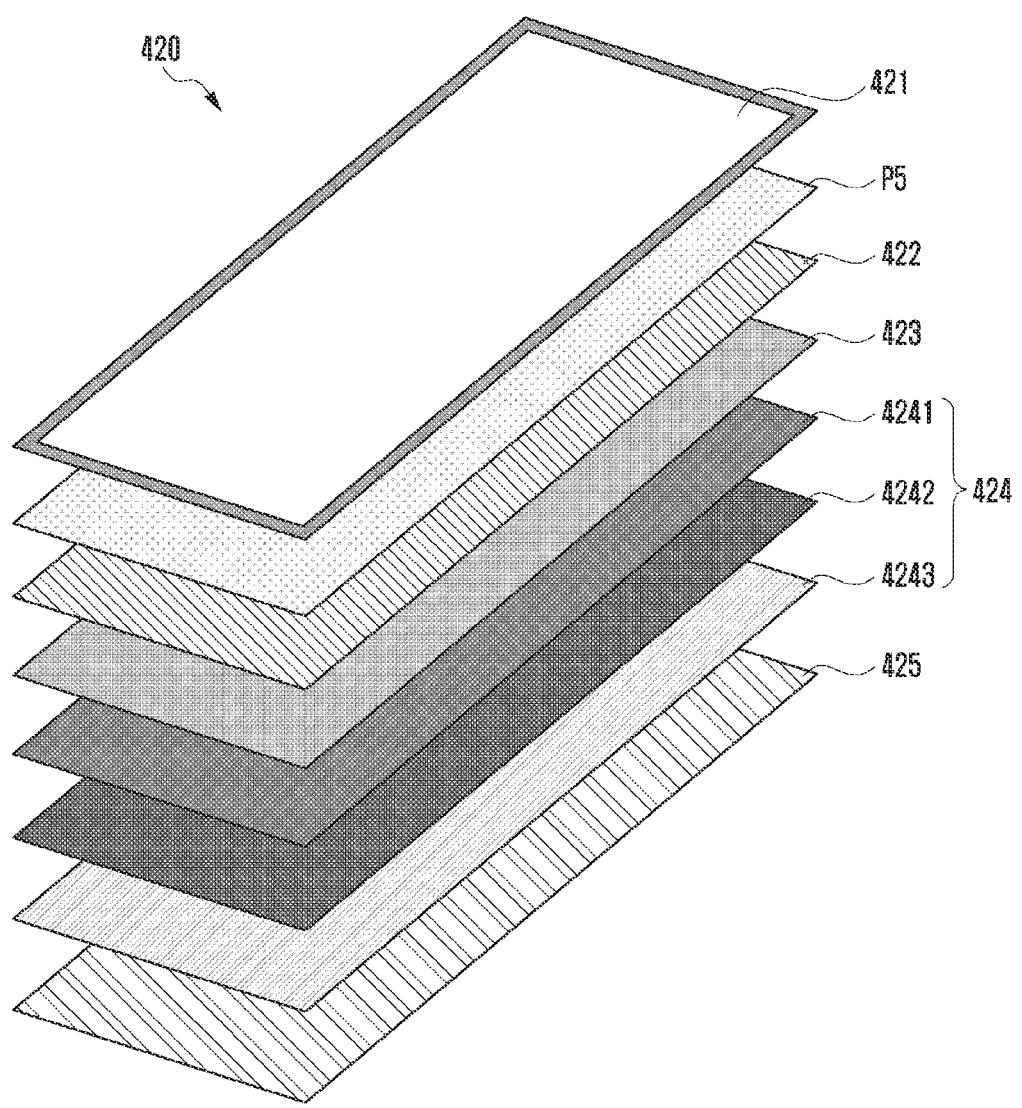
FIG. 4B is an exploded perspective view illustrating a stack structure of a second display according to various embodiments.

According to various embodiments, the first display 410 may include at least one functional member disposed between the polymer member 414 and the conductive members 4151 and 4152. According to an embodiment, the functional member may include a graphite sheet for heat dissipation, an added display, a force-touch FPCB, a fingerprint sensor FPCB, an antenna radiator for communication, a heat dissipation sheet, a conductive/non-conductive tape, or an open cell sponge. According to an embodiment, in case of being bendable, the functional member may be disposed from the first housing structure 110 to at least a portion of the second housing structure 120 through the hinge structure 164. In an embodiment, when bending is impossible, the functional member may be disposed individually in a region facing the first housing structure 110 and a region facing the second housing structure 120, except for the folding region facing the hinge structure 164. In still an embodiment, the display 410 may further include a detection member for detecting an input by a writing member of an electromagnetic induction type. According to an embodiment, the detection member may include a digitizer. FIG. 4B is an exploded perspective view illustrating a stack structure of a second display 420 according to various embodiments.

The second display 420 of FIG. 4B may be similar at least in part to the sub-display 152 of FIG. 3 or may further include other embodiments of the display. Referring to FIG. 4B, the second display 420 may include a second rear cover 421 (e.g., the second rear cover 150 of FIG. 1), and an adhesive member P5 (e.g., OCA), a polarizer (POL) 422, a display panel 423, at least one functional member 424, and a conductive member 425, which are sequentially stacked on the rear surface of the second rear cover 421. According to an embodiment, the adhesive member P5 may include an optical clear adhesive (OCA), a pressure sensitive adhesive (PSA), a heat-reactive adhesive, a general adhesive, or a double-sided tape. According to an embodiment, the display panel 423 and the POL 422 may be integrally formed.

According to various embodiments, the functional member 424 may include an embossed layer 4241, a cushion layer 4242, and a PI layer 4243, which are sequentially stacked on the rear surface of the display panel 423. According to an embodiment, the embossed layer 4241 may remove air bubbles that may be generated between the display panel 423 and underlying layers. According to an embodiment, the cushion layer 4242 may relieve an impact applied to the display 420. According to various embodiments, the functional member 424 may further include at least one of a graphite sheet for heat dissipation, an added display, a force-touch FPCB, a fingerprint sensor FPCB, an antenna radiator for communication, a heat dissipation sheet, a conductive/non-conductive tape, or an open cell sponge. According to an embodiment, the conductive member 425 is a metal plate, which may help to reinforce the rigidity of the electronic device (e.g., the electronic device 100 in FIG. 1), shield ambient noise, and dissipate heat emitted from surrounding components. According to an embodiment, the conductive member 425 may include at least one of copper (Cu), aluminum (Al), SUS, or a clad (e.g., a laminated stack of SUS and Al). In an embodiment, the display 420 may further include a detection member for detecting an input by a writing member of an electromagnetic induction type. According to an embodiment, the detection member may include a digitizer.

Figure 5:
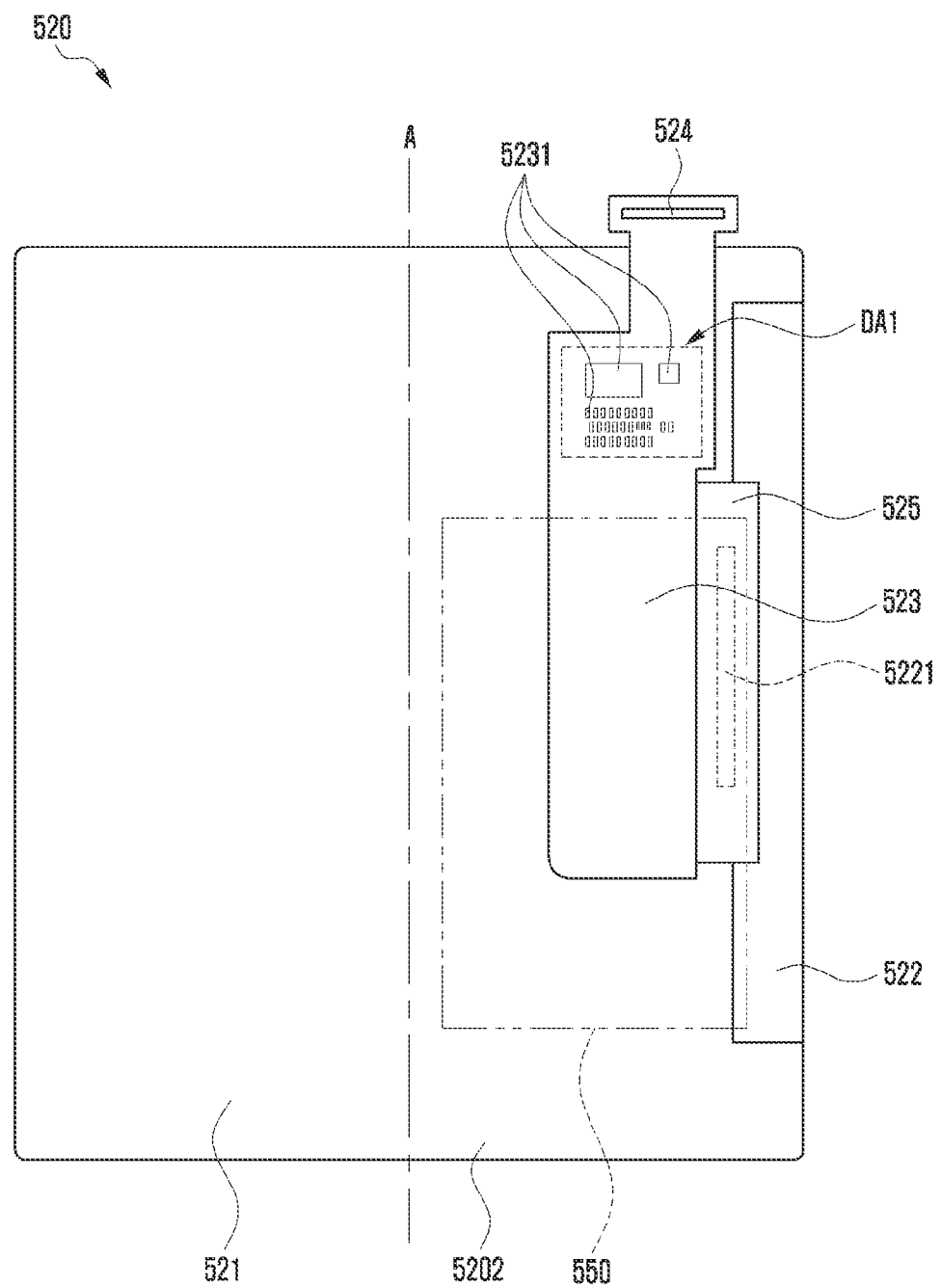
FIG. 5 is a diagram illustrating a rear surface structure of a first display according to various embodiments.

FIG. 5 is a diagram illustrating a rear surface structure of a first display 520 according to various embodiments.

The first display 520 of FIG. 5 may be similar at least in part to the display 130 of FIG. 3 or the first display 410 of FIG. 4A or may further include various embodiments of the first display.

Referring to FIG. 5, the first display 520 may include a flat portion 521, a bendable portion 522 extending from the flat portion 521 and bendable toward a rear surface 5202 of the first display 520, a connection pad 525 electrically connected to the bendable portion 522 and having an electrical wiring structure including a control circuit 5221, and a first flexible printed circuit board (FPCB) 523 electrically connected to the connection pad 525. According to an embodiment, the first display 520 may include a flexible display that is foldable to face each other based on the axis (A). According to an embodiment, the control circuit 5221 may include, for example, a display driver IC (DDI) or a touch display driver IC (TDDI) mounted on the connection pad 525 having the electrical wiring structure. According to an embodiment, the connection pad 525 may include a separate FPCB or film including the control circuit 5221 disposed in the form of a chip on film (COF). In an embodiment, the control circuit 5221 may have a chip on panel (COP) structure mounted on the bendable portion 522 without the connection pad 525. According to an embodiment, the first FPCB 523 may include a first device arrangement area DA1 in which a plurality of devices 5231 are mounted, and an electrical connector 524 disposed at an end of the first FPCB 523 and electrically connected to a second printed circuit board (e.g., the second printed circuit board 172 in FIG. 3) of an electronic device (e.g., the electronic device 100 in FIG. 3). According to an embodiment, the plurality of devices 5231 may include a touch IC, a flash memory for a display, a diode for reducing electro static discharge (ESD), or a passive element such as a decap. In an embodiment, when the bendable portion 522, the connection pad 525, and the first FPCB 523 are disposed in a region facing a first housing structure (e.g., the first housing structure 110 in FIG. 1) of the first display 520, the electrical connector 524 may also be electrically connected to a first printed circuit board (e.g., the first printed circuit board 171 in FIG. 3) of the electronic device (e.g., the electronic device 100 in FIG. 1).

According to various embodiments, because the electronic device (e.g., the electronic device 100 in FIG. 1) has two housing structures (e.g., the first housing structure 110 and the second housing structure 120 in FIG. 1) which are foldable with respect to each other based on the axis (A), the bendable portion 522 may be formed along a non-folding edge of the first display 520 in order to accommodate all electrode patterns of the first display 520. According to an embodiment, the first device arrangement area DA1 may be arranged to be biased toward one side of the first display, depending on the structural shape of the first FPCB 523. For example, the first device arrangement area DA1 may be arranged to be biased toward one side of a region facing a second housing structure (e.g., the second housing structure 120 in FIG. 1) of the first display 520. Considering that the plurality of devices mounted in the first device arrangement area DA1 may have a thickness, the above arrangement is to reduce an increase in the thickness of the electronic device 100 or a decrease in the volume of a second battery 550 due to an overlap between such a device having a thickness and the second battery 550 (e.g., the second battery 192 in FIG. 3) disposed inside the electronic device (e.g., the electronic device 110 in FIG. 1). Therefore, when the first display 520 is viewed from above, the first device arrangement area DA1 of the first FPCB 523 and the second battery 550 may be disposed so as not to overlap each other.

Figure 6:
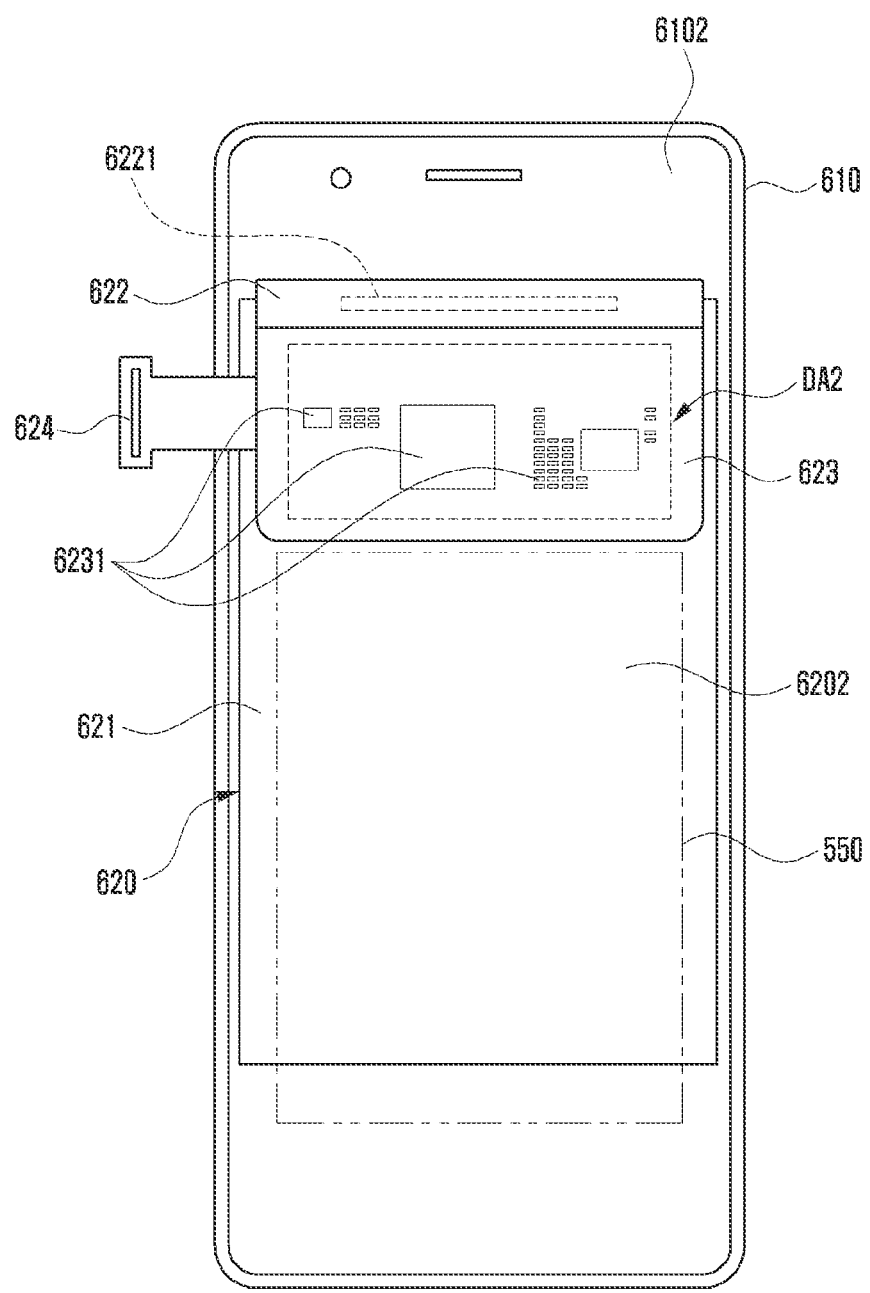
FIG. 6 is a diagram illustrating a rear surface structure of a second display according to various embodiments.

FIG. 6 is a diagram illustrating a rear surface structure of a second display 620 according to various embodiments.

The second display 620 of FIG. 6 may be similar at least in part to the sub-display 152 of FIG. 1 or the second display 420 of FIG. 4B or may further include other examples of the second display.

Referring to FIG. 6, the second display 620 is disposed on a rear surface 6102 of a second rear cover 610 (e.g., the second rear cover 150 in FIG. 3), and may be disposed to be seen from the outside through at least a part of the second rear cover 610. According to an embodiment, the second display 620 may include a flat portion 621, a bendable portion 622 being bendable toward a rear surface 6202 of the second display 620, and a second flexible printed circuit board (FPCB) 623 electrically connected to the bendable portion 622. According to an embodiment, the second display 620 may include a control circuit 6221 mounted on the bendable portion 622. According to an embodiment, the control circuit 6221 may include a display driver IC (DDI) or a touch display driver IC (TDDI) mounted on the bendable portion 622. According to an embodiment, the DDI or TDDI may have a chip on panel (COP) structure mounted on the bendable portion 622. According to an embodiment, the second FPCB 623 may include a second device arrangement area DA2 in which a plurality of devices 6231 are mounted, and an electrical connector 624 drawn from the second FPCB 623 for electrical connection and electrically connected to a second printed circuit board (e.g., the second printed circuit board 172 in FIG. 3) of an electronic device (e.g., the electronic device 100 in FIG. 3). According to an embodiment, the plurality of devices 6231 may include a touch IC, a flash memory for a display, a diode for reducing electro static discharge (ESD), or a passive element such as a decap. According to various embodiments, because the electronic device (e.g., the electronic device 100 in FIG. 1) has two housing structures (e.g., the first housing structure 110 and the second housing structure 120 in FIG. 1) which are foldable with respect to each other based on the axis (A), the internal space of the second housing structure 120 may be narrow. Therefore, considering the arrangement of the second battery 550, the second device arrangement area DA2 may be arranged to be biased toward one side of the second display 620. For example, the second device arrangement area DA2 may be arranged to be biased toward one side of a region facing a second housing structure (e.g., the second housing structure 120 in FIG. 1) of the second display 620. Considering that the plurality of devices mounted in the second device arrangement area DA2 may have a thickness, the above arrangement is to reduce an increase in the thickness of the electronic device 100 or a decrease in the volume of a second battery 550 due to an overlap between such a device having a thickness and the second battery 550 (e.g., the second battery 192 in FIG. 3) disposed inside the electronic device (e.g., the electronic device 110 in FIG. 1). Therefore, when the second display 620 is viewed from above, the second device arrangement area DA2 of the second FPCB 623 and the second battery 550 may be disposed so as not to overlap each other.

Figure 7:
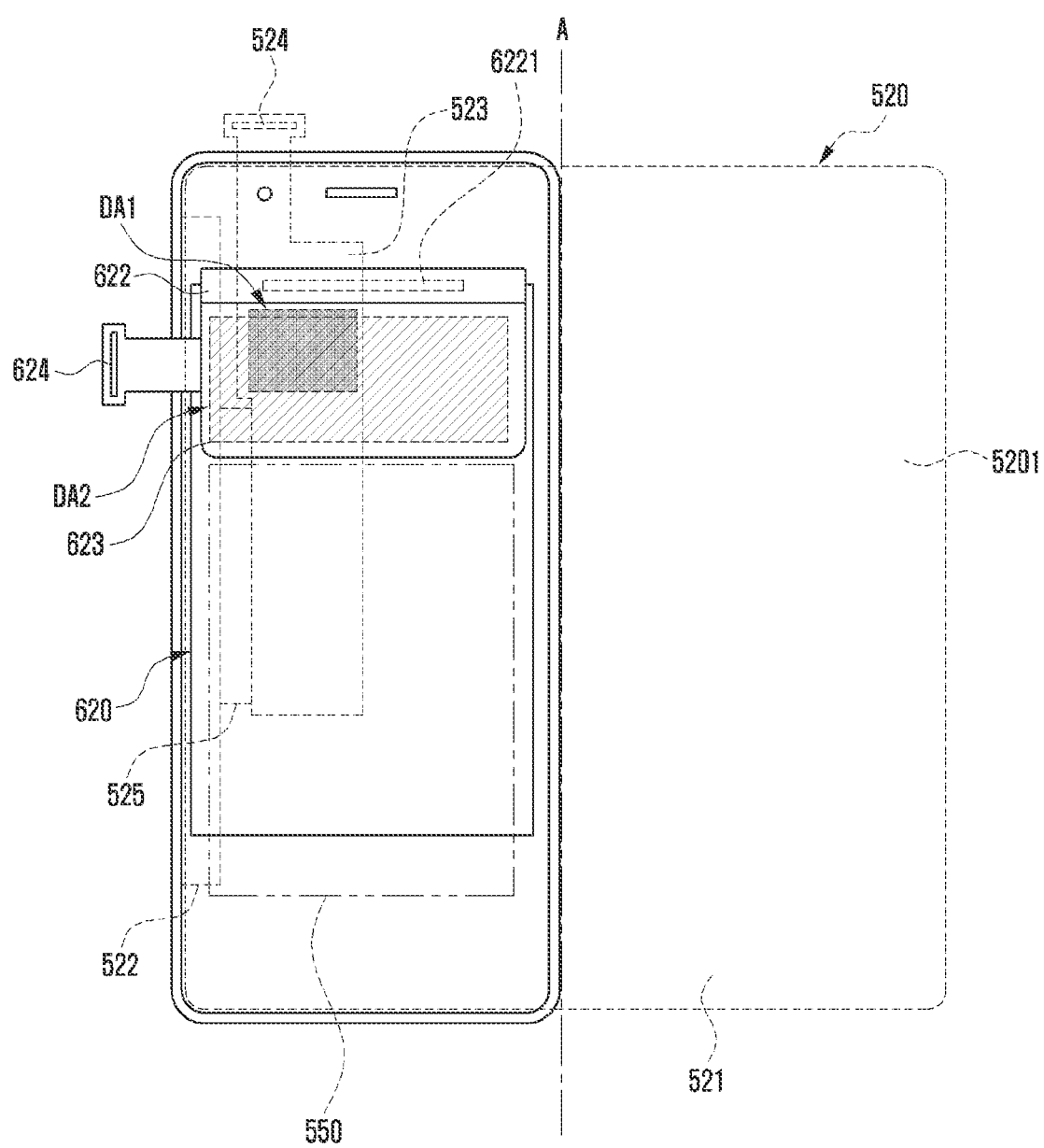
FIG. 7 is a diagram illustrating a state in which a first display and a second display overlap each other according to various embodiments.

FIG. 7 is a diagram illustrating a state in which a first display 520 and a second display 620 overlap each other according to various embodiments.

Referring to FIG. 7, when the first display 520 is viewed from above (e.g., when the front surface 5201 of the first display is viewed from above), the second display 620 may be disposed to overlap at least a part of the first display 520. According to an embodiment, the second display 620 may be disposed to overlap a region of the first display 520 facing the second housing structure (e.g., the second housing structure 120 in FIG. 1). In this case, the second battery 550 may be disposed between the first display 520 and the second display 620. According to an embodiment, when the first display 520 is viewed from above, the second battery 550 may be arranged in parallel with both the first device arrangement area DA1 of the first display 520 and the second device arrangement area DA2 of the second display 620 without an overlap. For example, the first device arrangement area DA1 and the second device arrangement area DA2 may be disposed near the edge of the second battery 550 on one side of the second battery 550. According to an embodiment, when the first display 520 is viewed from above, the first device arrangement area DA1 and the second device arrangement area DA2 may be arranged to overlap at least in part.

According to various embodiments, when the second display 620 is viewed from above, even if the second device arrangement area DA2 does not overlap the second battery 550, at least a part of the remaining area of the second display 620 may be disposed to be supported by the second battery 550. Therefore, because of the efficient arrangement of the first device arrangement area DA1 and/or the second device arrangement area DA2 in the internal space of the second housing structure (e.g., the second housing structure 120 in FIG. 1), the volume of the second battery may increases resulting in an increase of capacity, or even if the volume of the second battery does not change, the electronic device may be slimmed.

Figure 8A:
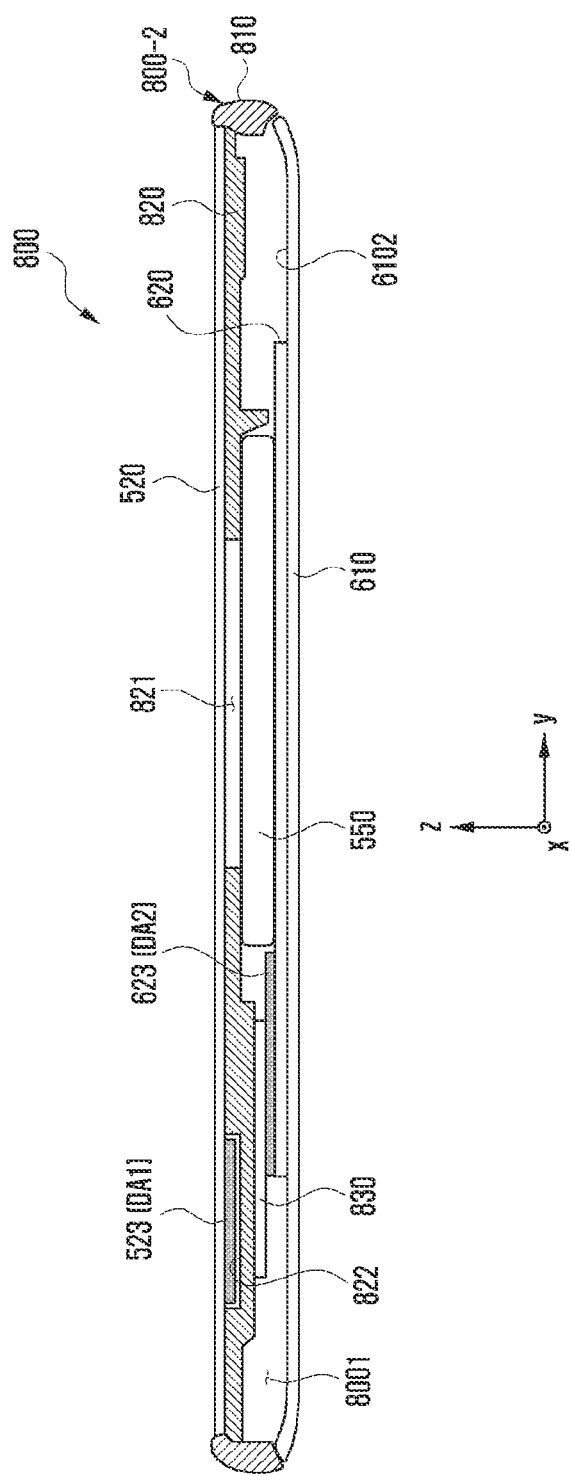
FIG. 8A is a cross-sectional view illustrating an electronic device taken along the line B-B' of FIG. 1 according to various embodiments.

FIG. 8A is a cross-sectional view illustrating an electronic device 800 taken along the line B-B' of FIG. 1 according to various embodiments of the disclosure.

The electronic device 800 of FIG. 8A may be similar at least in part to the electronic device 100 of FIG. 1, or may further include other embodiments of the electronic device.

Referring to FIG. 8A, the electronic device 800 (e.g., the electronic device 100 in FIG. 1) may include a second support member (e.g., a support) 820 (e.g., the second support member 162 in FIG. 3) disposed in an internal space 8001 and extended from or structurally combined with a second side member 810 (e.g., the second side member 123 in FIG. 1) of a second housing structure 800-2 (e.g., the second housing structure 120 in FIG. 1). According to an embodiment, the electronic device 800 may include the first display 520 disposed to be supported by the second support member 820. According to an embodiment, the first display 520 may include the first FPCB 523 having the first device arrangement area DA1 disposed to be foldable toward the rear surface of the first display 520. According to an embodiment, the second support member 820 may include a recess 822 formed to accommodate the first device arrangement area DA1 of the first FPCB 523. According to an embodiment, the second support member 820 may have a swelling hole 821 (e.g., the second swelling hole 1612 in FIG. 3) formed to accommodate a swelling phenomenon of the second battery 550 disposed in an internal space 8001 of the electronic device 800.

According to various embodiments, the electronic device 800 may include the second rear cover 610 disposed to face in a direction opposite to the first display 520. According to an embodiment, the electronic device 800 may include the second display 620 disposed on the rear surface 6102 of the second rear cover 610 in the internal space 8001 and disposed to be visible from the outside through at least a part of the second rear cover. According to an embodiment, the second display 620 may include the second FPCB 623 having the second device arrangement area DA2 that is foldable to the rear surface. According to an embodiment, when the first display 520 is viewed from above, the first device arrangement area DA1 and/or the second device arrangement area DA2 may be disposed not to overlap the second battery 550. According to an embodiment, the second device arrangement area DA2 may be disposed close to the edge of the second battery 550.

According to various embodiments, the electronic device 800 may include a second printed circuit board 830 (e.g., the second printed circuit board 172 in FIG. 3) disposed between the second support member 820 and the second rear cover 610. According to an embodiment, the second printed circuit board 830 may be disposed to be supported by the second support member 820, and may be electrically connected to the first FPCB 523 and the second FPCB 623. According to various embodiments, the second display 620 may be disposed to be supported at least in part by the second battery 550. In this case, the second device arrangement area DA2 disposed on the rear surface of the second display 620 may be excluded. According to an embodiment, a cushion member, an insulating member, or an adhesive member may be further included between the second display 620 and the second battery 550.

The above embodiments of the disclosure provide an efficient dual display stack structure in which the first device arrangement area DA1 of the first display 520 and the second device arrangement area DA2 of the second display 620 are disposed so as not to overlap the second battery 550, and at least a part of the second display 620 is directly supported by the second battery 550. Accordingly, a battery capacity may increase by means of an increase in the volume of the second battery 550, or otherwise the electronic device 800 may be slimmed.

Figure 8B:
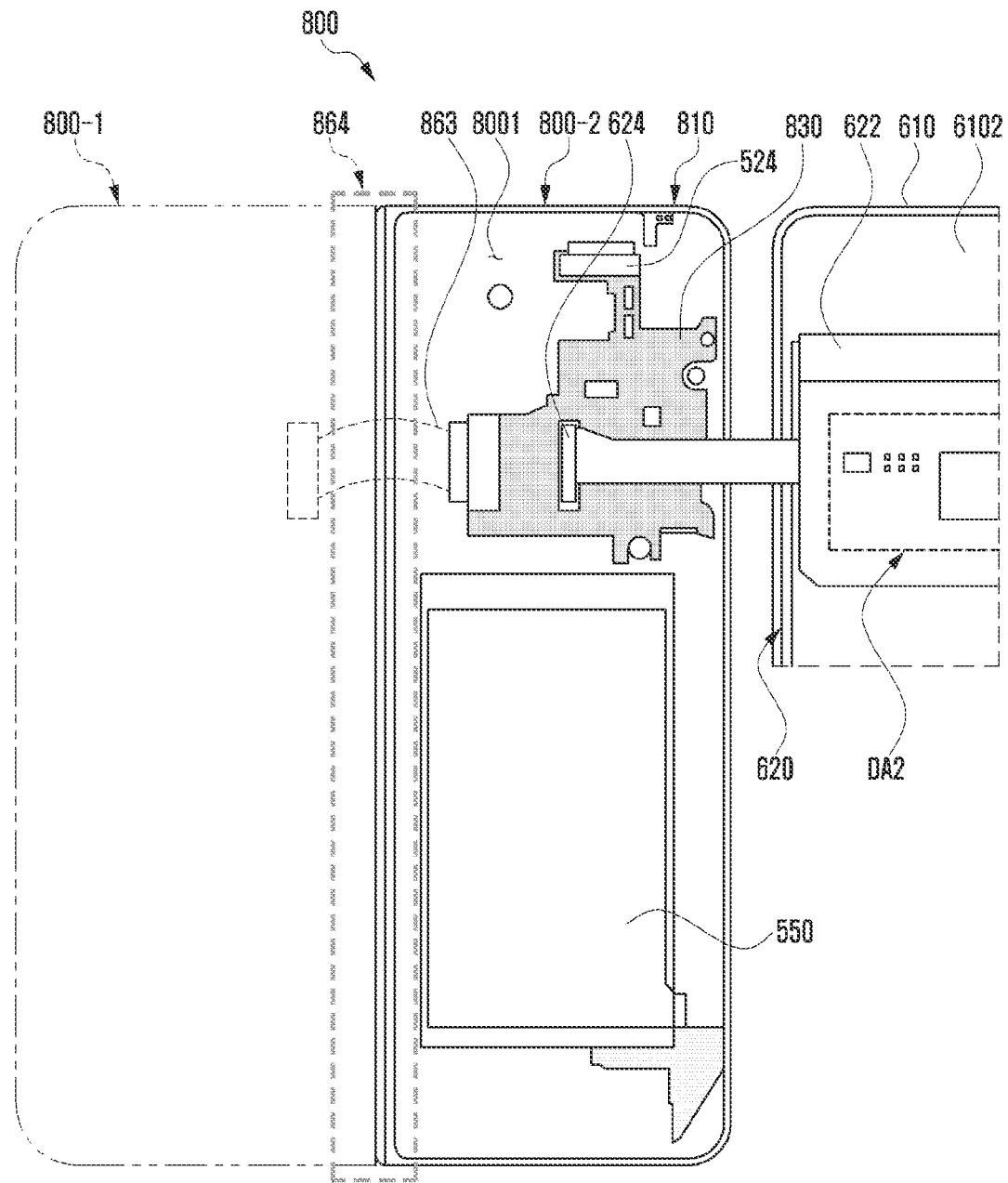
FIG. 8B is a diagram illustrating a state in which the first and second displays of FIG. 8A are connected to a printed circuit board according to various embodiments.

FIG. 8B is a diagram illustrating a state in which the first and second displays 520 and 620 of FIG. 8A are connected to a printed circuit board 830 according to various embodiments.

Referring to FIG. 8B, the electronic device 800 may include a first housing structure 800-1 (e.g., the first housing structure 110 in FIG. 1) and a second housing structure 800-2 (e.g., the second housing structure 120 in FIG. 1) disposed to be rotatable via a hinge structure 864 (e.g., the hinge structure 164 in FIG. 3). According to an embodiment, a second printed circuit board 830 (e.g., the second printed circuit board 172 in FIG. 3) may be disposed at least in part in the internal space 8001 of the second housing structure 800-2. According to an embodiment, the second printed circuit board 830 may be disposed so as not to overlap the battery 550 disposed in the space 8001. According to an embodiment, the second printed circuit board 830 may be electrically connected to a first printed circuit board (e.g., the first printed circuit board 171 in FIG. 3) disposed in the first housing structure 800-1 through at least one wiring member 863 (e.g., the wiring member 163 in FIG. 3) disposed to cross via the hinge structure 864. According to an embodiment, the first display 520 may be electrically connected to the second printed circuit board 830 through the connector member 524 drawn from the first FPCB (e.g., the first FPCB 523 in FIG. 5). According to an embodiment, the second display 620 may be electrically connected to the second printed circuit board 830 through the connector member 624 drawn from the second FPCB (e.g., the second FPCB 623 in FIG. 6). According to an embodiment, the connector member 524 drawn out from the first FPCB 523 and the connector member 624 drawn out from the second FPCB 623 may be electrically connected to the same surface of the second printed circuit board 830. In an embodiment, the connector member 524 drawn out from the first FPCB 523 and the connector member 624 drawn out from the second FPCB 623 may also be electrically connected to different surfaces (e.g., opposite surfaces) of the second printed circuit board 830.

The above-described structure that can avoid an overlap arrangement between the device arrangement area of the dual display and the battery and can allow a support arrangement of the second display by the battery according to the embodiments of the disclosure may also be applied to a bar type electronic device including a dual display.

Figure 9A:
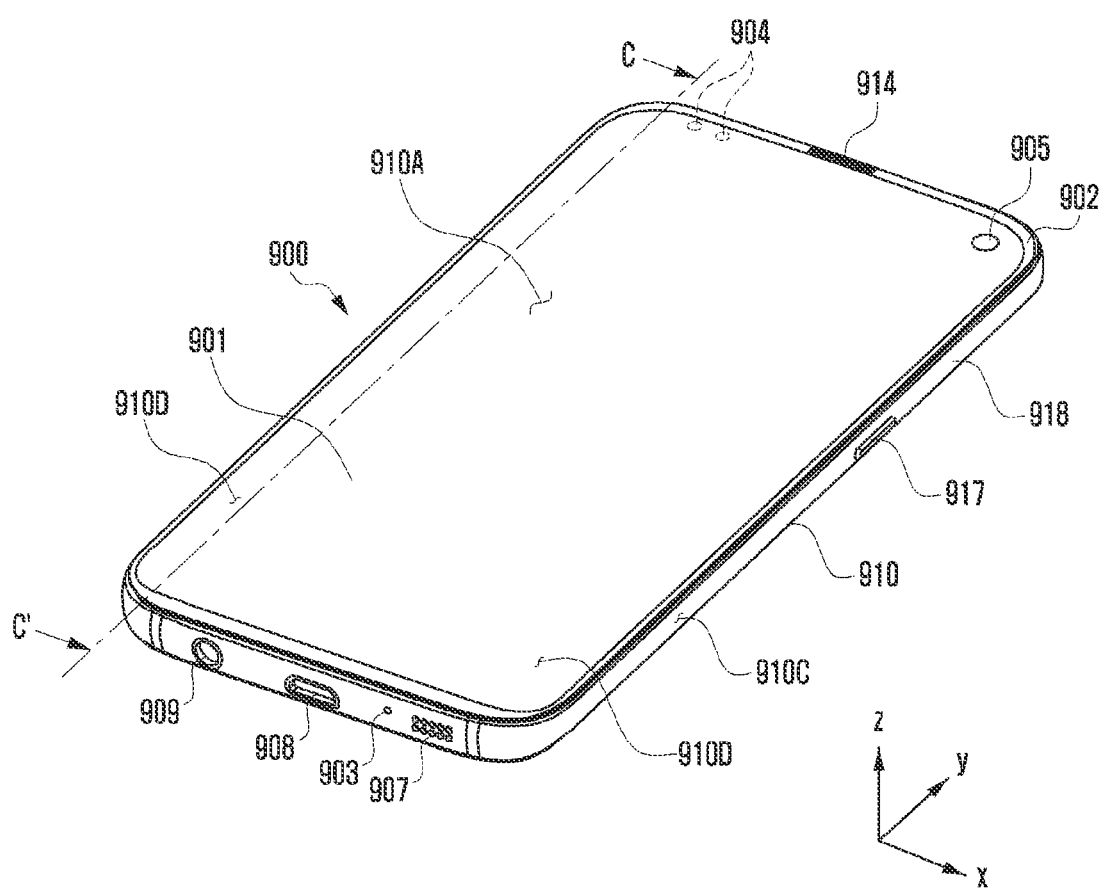
FIG. 9A is a front perspective view illustrating an electronic device according to various embodiments.
Figure 9B:
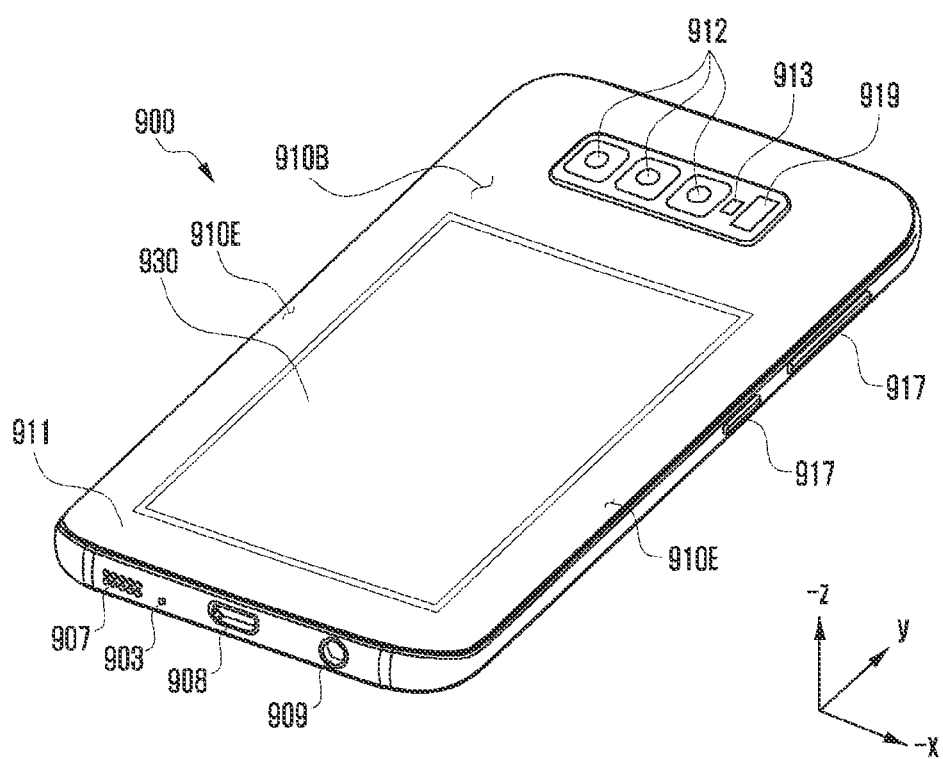
FIG. 9B is a rear perspective view illustrating an electronic device according to various embodiments.

Hereinafter, the bar type electronic device will be described in greater detail. FIG. 9A is a front perspective view illustrating an electronic device 900 according to various embodiments of the disclosure. FIG. 9B is a rear perspective view illustrating an electronic device 900 according to various embodiments of the disclosure.

Referring to FIGS. 9A and 9B, the electronic device 900 according to an embodiment may include a housing 910 that includes a first surface (or front surface) 910A, a second surface (or rear surface) 910B, and a side surface 910C surrounding a space between the first surface 910A and the second surface 910B. In an embodiment (not shown), the housing 910 may refer to a structure that forms some of the first surface 910A, the second surface 910B, and the side surface 910C in FIG. 1. According to an embodiment, the first surface 910A may be formed by a front plate 902 (e.g., a glass plate having various coating layers, or a polymer plate) at least a portion of which is substantially transparent. The second surface 910B may be formed by a substantially opaque rear plate 911. The rear plate 911 may be formed of, for example, coated or colored glass, ceramic, polymer, metal (e.g., aluminum, stainless steel (STS), or magnesium), or a combination of at least two of the above materials. The side surface 910C may be formed by a lateral bezel structure 918 (or "side member" or "side frame") including a metal and/or a polymer and combined with the front plate 902 and the rear plate 911. In a certain embodiment, the rear plate 911 and the lateral bezel structure 918 may be integrally formed and may have the same material (e.g., a metal material such as aluminum).

In the illustrated embodiment, the front plate 902 may have, in both long edges thereof, a first region 910D that is seamlessly extended from the first surface 910A and bent toward the rear plate. In the illustrated embodiment (see FIG. 9B), the rear plate 911 may have, in both long edges thereof, a second region 910E that is seamlessly extended from the second surface 910B and bent toward the front plate. In various embodiments, the front plate 902 or the rear plate 911 may have only one of the first region 910D or the second region 910E. In various embodiments, the front plate 902 may not have the first region and the second region, and may have only a flat plane disposed in parallel with the second surface 910B. In the above embodiment, when viewed from the side of the electronic device, the lateral bezel structure 918 may have a first thickness (or width) at a side surface not having the first region 910D nor the second region 910E, and may have a second thickness smaller than the first thickness at a side surface having the first region or the second region. According to an embodiment, the electronic device 900 may include at least one of a display 901, an input device 903, sound output devices 907 and 914, sensor modules 904 and 919, camera modules 905, 912, and 913, a key input device 917, an indicator (not shown), and connectors 908 and 909. In various embodiments, the electronic device 900 may omit at least one (e.g., the key input device 917 or the indicator) of the above components or further include any other component.

The display 901 may be visible through a considerable portion of the front plate 902, for example. In various embodiments, at least a portion of the display 901 may be visible through the front plate 902 that forms the first surface 910A and the first region 910D of the side surface 910C. The display 901 may be combined with or disposed adjacent to a touch sensing circuit, a pressure sensor for measuring the intensity (pressure) of a touch, and/or a digitizer for detecting a stylus pen of a magnetic field type. In various embodiments, at least a part of the sensor modules 904 and 919, and/or at least a part of the key input device 917 may be disposed in the first region 910D and/or the second region 910E.

The input device 903 may include a microphone 903. In various embodiments, the input device 903 may include a plurality of microphones 903 arranged to identify the direction of sound. The sound output devices 907 and 914 may include speakers 907 and 914. The speakers 907 and 914 may include an external speaker 907 and a call receiver 914. In various embodiments, the microphone 903, the speakers 907 and 914, and the connectors 908 and 909 may be disposed in the space of the electronic device 900 and exposed to an external environment through at least one hole formed in the housing 910. In various embodiments, such a hole formed in the housing 910 may be commonly used for the microphone 903 and the speakers 907 and 914. In various embodiments, the sound output devices 907 and 914 may include a speaker (e.g., a piezo speaker) that operates without any hole formed in the housing 910.

The sensor modules 904 and 919 may generate an electrical signal or data value corresponding to an internal operating state of the electronic device 900 or an external environmental state. The sensor modules 904 and 919 may include, for example, a first sensor module 904 (e.g., a proximity sensor) and/or a second sensor module (not shown) (e.g., a fingerprint sensor) disposed in the first surface 910A of the housing 910, and/or a third sensor module 919 (e.g., an HRM sensor) disposed in the second surface 910B of the housing 910. The fingerprint sensor may be disposed in the first surface 910A of the housing 910. The fingerprint sensor (e.g., an ultrasonic type or an optical type) may be disposed under the display 901 in the first surface 910A. The electronic device 900 may further include a sensor module not shown, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor 904.

The camera modules 905, 912, and 913 may include a first camera device 905 disposed in the first surface 910A of the electronic device 900, a second camera device 912 disposed in the second surface 910B of the electronic device 900, and/or a flash 913. The camera modules 905 and 912 may include one or more lenses, an image sensor, and/or an image signal processor. The flash 913 may include, for example, a light emitting diode or a xenon lamp. In various embodiments, two or more lenses (wide angle and telephoto lenses) and image sensors may be disposed in one surface of the electronic device 900. The key input device 917 may be disposed in the side surface 910C of the housing 910. In an embodiment, the electronic device 900 may not include some or all of the above-mentioned key input devices 917, which may be implemented in another form, such as a soft key, on the display 901. In an embodiment, the key input device 917 may be implemented using a pressure sensor included in the display 901.

The indicator may be disposed, for example, in the first surface 910A of the housing 910. The indicator may provide, for example, status information of the electronic device 900 in the form of light. In an embodiment, the light emitting device may provide, for example, a light source that inter-operates with the camera module 905. The indicator may include, for example, LED, IR LED, and xenon lamp.

The connector holes 908 and 909 may include a first connector hole 908 capable of receiving a connector (e.g., a USB connector or an interface connector port module (IF) module) for transmitting and receiving power and/or data to and from an external electronic device, and/or a second connector hole 909 (or earphone jack) capable of receiving a connector for transmitting and receiving audio signals to and from an external electronic device.

Some of the camera modules 905 and 912, some of the sensor modules 904 and 919, or the indicator may be disposed to be exposed through the display 101. For example, the camera module 905, the sensor module 904, or the indicator may be disposed so as to be in contact with the external environment through an opening perforated to the front plate 902 of the display 901 in the internal space of the electronic device 900. In an embodiment, the sensor module 904 may be arranged to perform its function without being visually exposed through the front plate 902 in the internal space of the electronic device. For example, in this case, a region of the display 901 facing the sensor module may not need a perforated opening.

According to various embodiments, the electronic device 900 may include a sub-display 930 that is disposed to be visible from the outside through at least a part of the rear plate 911. According to an embodiment, the sub-display 930 may be activated to reduce power consumption and perform a relatively simple function of the electronic device 900 while the display 901 of the electronic device 900 is inactive.

Figure 10:
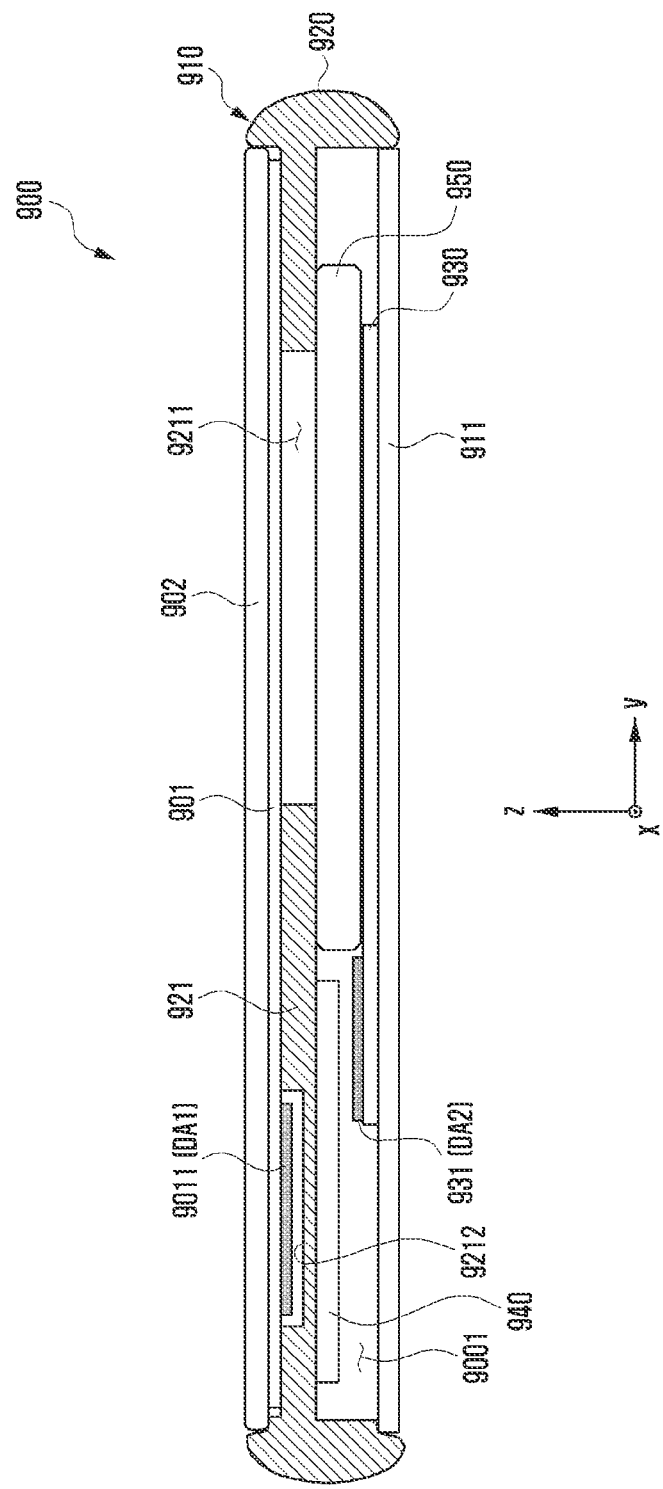
FIG. 10 is a cross-sectional view illustrating an electronic device taken along the line C-C' of FIG. 9A according to various embodiments.

FIG. 10 is a cross-sectional view illustrating an electronic device 900 taken along the line C-C' of FIG. 9A according to various embodiments.

Referring to FIG. 10, the electronic device 900 may include a housing 910 that includes a front plate 902, a rear plate 911 facing in the opposite direction to the front plate 902, and a side member 920 (e.g., a side frame) surrounding an internal space 9001 between the front plate 902 and the rear plate 911. According to an embodiment, the electronic device 900 may include a support member 921 disposed in the internal space 9001 and extended from the side member 920 or structurally coupled to the side member 920. According to an embodiment, the electronic device 900 may include a display 901 (e.g., the first display) disposed to be supported by the support member 921. According to an embodiment, the display 901 may be arranged to be visible from the outside at least in part through the front plate 902. According to an embodiment, the display 901 may include a first FPCB 9011 having a first device arrangement area DA1 arranged to be foldable toward the rear surface of the display 901. According to an embodiment, the support member 921 may include a recess 9212 formed to accommodate the first device arrangement area DA1 of the first FPCB 9011. According to an embodiment, the support member 921 may have a swelling hole 9211 formed to accommodate a swelling phenomenon of the battery 950 disposed in the internal space 9001 of the electronic device 900.

According to various embodiments, the electronic device 900 may include a sub-display 930 (e.g., the second display) disposed to be visible from the outside through at least a part of the rear plate 911 in the internal space 9001. According to an embodiment, the sub-display 930 may include a second FPCB 931 having a second device arrangement area DA2 that is foldable to the rear surface. According to an embodiment, when the front plate 902 is viewed from above, the first device arrangement area DA1 and/or the second device arrangement area DA2 may be disposed so as not to overlap the battery 950. According to an embodiment, the second device arrangement area DA2 may be disposed close to the edge of the battery 950.

According to various embodiments, the electronic device 900 may include a printed circuit board 940 disposed between the support member 921 and the rear plate 911. According to an embodiment, the printed circuit board 940 may be disposed to be supported by the support member 921, and may be electrically connected to the first FPCB 9011 and the second FPCB 931.

According to various embodiments, the sub-display 930 may be disposed to be supported at least in part by the battery 950. In this case, the second device arrangement area DA2 disposed on the rear surface of the sub-display 930 may be excluded. According to an embodiment, a cushion member, an insulating member, or an adhesive member may be further included between the sub-display 930 and the battery 950.

The above example embodiments of the disclosure provide an efficient dual display stack structure in which the first device arrangement area DA1 of the display 901 and the second device arrangement area DA2 of the sub-display 930 are disposed so as not to overlap the battery 950, and at least a part of the sub-display 930 is directly supported by the battery 950. Accordingly, a battery capacity may increase by means of an increase in the volume of the battery 950, or otherwise the electronic device 900 may be slimmed.

According to various example embodiments, an electronic device (e.g., the electronic device 100 in FIG. 3) may include: a housing including a hinge module (e.g., the hinge structure 164 in FIG. 3) comprising a hinge, a first housing (e.g., the first housing structure 110 in FIG. 3) including a first plate (e.g., the first support member 161 in FIG. 3) connected to the hinge module, a second plate (e.g., the second support member 162 in FIG. 3) facing in a direction opposite the first plate, and a first side frame (e.g., the first side member 113 in FIG. 1) surrounding a first space between the first plate and the second plate, and a second housing (e.g., the second housing structure 120 in FIG. 3) including a third plate (e.g., the first rear cover 140 in FIG. 3) connected to the hinge module, a fourth plate (e.g., the second rear cover 150 in FIG. 3) facing in a direction opposite the third plate, and a second side frame (e.g., the second side member 123 in FIG. 1) surrounding a second space between the third plate and the fourth plate, wherein the first housing and the second housing are configured to be folded or unfolded with regard to each other using the hinge module; a printed circuit board (e.g., the second printed circuit board 830 in FIG. 8) disposed in the second space; a first display (e.g., the first display 520 in FIG. 8) supported by the first plate and the third plate; a battery (e.g., the battery 550 in FIG. 8) disposed between the third plate and the fourth plate in the second space; and a second display (e.g., the second display 620 in FIG. 8) disposed between the battery and the fourth plate and visible from outside through at least a part of the fourth plate, wherein at least a part of the second display is disposed to face the battery.

According to various example embodiments, the first display (e.g., the first display 520 in FIG. 5) may include a flat portion (e.g., the flat portion 521 in FIG. 5), a bendable portion (e.g., the bendable portion 522 in FIG. 5) bendable from the flat portion toward a rear surface (e.g., the rear surface 5202 in FIG. 5) of the second display, and a first flexible printed circuit board (FPCB) (e.g., the first FPCB 523 in FIG. 5) electrically connected to the bendable portion on a rear surface of the first display, electrically connected to the printed circuit board, and having a first device arrangement area (e.g., the first device arrangement area DA1 in FIG. 5) in which a plurality of devices are mounted, wherein when the first display is viewed from above, the first device arrangement area is disposed to not overlap the battery.

According to various example embodiments, the first display may further include a connection pad (e.g., the connection pad 525 in FIG. 5) electrically connecting the bendable portion and the first FPCB and including a control circuit (e.g., the control circuit 5221 in FIG. 5).

According to various example embodiments, the control circuit may include a display driver IC (DDI) or a touch display driver IC (TDDI).

According to various example embodiments, the third plate may include a recess (e.g., the recess 822 in FIG. 8) accommodating the first device arrangement area.

According to various example embodiments, the second display (e.g., the second display 620 in FIG. 6) may include a flat portion (e.g., the flat portion 621 in FIG. 6), a bendable portion (e.g., the bendable portion 621 in FIG. 6) bendable from the flat portion toward a rear surface (e.g., the rear surface 6202 in FIG. 6) of the second display and including a control circuit (e.g., the control circuit 6221 in FIG. 6), and a second FPCB (e.g., the second FPCB 623 in FIG. 6) electrically connected to the bendable portion on the rear surface of the second display, electrically connected to the printed circuit board, and having a second device arrangement area (e.g., the second device arrangement area DA2 in FIG. 6) in which a plurality of devices are mounted, wherein when the first display is viewed from above, the second device arrangement area is disposed to not overlap the battery.

According to various example embodiments, when the first display is viewed from above, the first device arrangement area of the first FPCB and the second device arrangement area of the second FPCB may overlap each other at least in part.

According to various example embodiments, when the first display is viewed from above, the second device arrangement area of the second FPCB may be disposed closer to the battery than the printed circuit board.

According to various example embodiments, the control circuit may include a display driver IC (DDI) or a touch display driver IC (TDDI).

According to various example embodiments, the third plate may further include a swelling hole (e.g., the swelling hole 821 in FIG. 8) formed in at least a partial region facing the battery.

According to various example embodiments, the printed circuit board may be disposed between the third plate and the second display in the second space. According to various example embodiments, an electronic device (e.g., the electronic device 900 in FIG. 10) may include a housing (e.g., the housing 910 in FIG. 10) including a front plate (e.g., the front plate 902 in FIG. 10), a rear plate (e.g., the rear plate 911 in FIG. 10) facing a direction opposite the front plate, and a side frame (e.g., the side member 920 in FIG. 10) surrounding a space (e.g., the space 9001 in FIG. 10) between the front plate and the rear plate and including a support (e.g., the support member 921 in FIG. 10) extending toward the space; a printed circuit board (e.g., the printed circuit board 940 in FIG. 10) disposed in the space; a first display (e.g., the display 901 in FIG. 10) disposed between the support and the front plate and visible from outside through at least a part of the front plate; a battery (e.g., the battery 950 in FIG. 10) disposed in the space; and a second display (e.g., the sub-display 930 in FIG. 10) disposed between the battery and the rear plate and visible from outside through at least a part of the rear plate, wherein at least a part of the second display is disposed to face the battery.

According to various example embodiments, the first display may include a flat portion, a bendable portion bendable from the flat portion toward a rear surface of the second display and including a control circuit, and a first flexible printed circuit board (FPCB) electrically connected to the bendable portion on a rear surface of the first display, electrically connected to the printed circuit board, and having a first device arrangement area in which a plurality of devices are mounted, wherein when the first display is viewed from above, the first device arrangement area is disposed to not overlap the battery.

According to various example embodiments, the control circuit may include a display driver IC (DDI) or a touch display driver IC (TDDI).

According to various example embodiments, the support may include a recess (e.g., the recess 9212 in FIG. 10) accommodating the first device arrangement area.

According to various example embodiments, the second display may include a flat portion, a bendable portion bendable from the flat portion toward a rear surface of the second display and including a control circuit, and a second FPCB electrically connected to the bendable portion on the rear surface of the second display, electrically connected to the printed circuit board, and having a second device arrangement area in which a plurality of devices are mounted, wherein when the front plate is viewed from above, the second device arrangement area is disposed to not overlap the battery.

According to various example embodiments, when the front plate is viewed from above, the first device arrangement area (e.g., the first device arrangement area DA1 in FIG. 10) of the first FPCB and the second device arrangement area (e.g., the second device arrangement area DA2 in FIG. 10) of the second FPCB may overlap each other at least in part.

According to various example embodiments, when the first display is viewed from above, the second device arrangement area of the second FPCB may be disposed closer to the battery than the printed circuit board.

According to various example embodiments, the control circuit may include a display driver IC (DDI) or a touch display driver IC (TDDI).

According to various example embodiments, the support may further include a swelling hole (e.g., the swelling hole 9211 in FIG. 10) formed in at least a partial region facing the battery.

The various example embodiments of the disclosure are merely provided \to explain the technical contents and help the understanding of the various example embodiments of the disclosure, and are not intended to limit the scope of the disclosure. Therefore, the scope of the disclosure should be understood to include all changes or modifications derived from the technical ideas of various example embodiments of the disclosure in addition to the various example embodiments disclosed herein.

What is claimed is:

1. An electronic device comprising:
a housing including:
a hinge module comprising a hinge;
a first housing including a first plate connected to the hinge module, a second plate configured for facing a direction opposite the first plate, and a first side frame surrounding a first space between at least the first plate and the second plate; and
a second housing including a third plate connected to the hinge module, a fourth plate configured for facing a direction opposite the third plate, and a second side frame surrounding a second space between at least the third plate and the fourth plate,
wherein the first housing and the second housing are configured to be folded or unfolded with regard to each other based on the hinge module;
a printed circuit board disposed in the second space;
a first display supported by the first plate and the third plate;
a battery disposed between the third plate and the fourth plate in the second space; and
a second display disposed between at least the battery and the fourth plate and viewable by a user through at least a part of the fourth plate,
wherein at least a part of the second display is disposed to face the battery, and wherein at least a portion of the battery is located between at least the first display and the second display.

2. The electronic device of claim 1, wherein the first display includes:
a flat portion;
a bendable portion bendable from the flat portion toward a rear surface of the second display; and
a first flexible printed circuit board (FPCB) electrically connected to the bendable portion on a rear surface of the first display, electrically connected to the printed circuit board, and having a first device arrangement area in which a plurality of devices are mounted,
wherein when the first display is viewed from above, the first device arrangement area is disposed to not overlap the battery.

3. The electronic device of claim 2, wherein the first display further includes a connection pad electrically connecting the bendable portion and the first FPCB and including a control circuit.

4. The electronic device of claim 3, wherein the control circuit includes a display driver IC (DDI) or a touch display driver IC (TDDI).

5. The electronic device of claim 2, wherein the third plate includes a recess accommodating the first device arrangement area.

6. The electronic device of claim 2, wherein the second display includes:
a flat portion;
a bendable portion bendable from the flat portion toward a rear surface of the second display and including a control circuit; and
a second FPCB electrically connected to the bendable portion on the rear surface of the second display, electrically connected to the printed circuit board, and having a second device arrangement area in which a plurality of devices are mounted,
wherein when the first display is viewed from above, the second device arrangement area is disposed to not overlap the battery.

7. The electronic device of claim 6, wherein when the first display is viewed from above, the first device arrangement area of the first FPCB and the second device arrangement area of the second FPCB overlap each other at least in part.

8. The electronic device of claim 6, wherein when the first display is viewed from above, the second device arrangement area of the second FPCB is disposed closer to the battery than the printed circuit board.

9. The electronic device of claim 6, wherein the control circuit includes a display driver IC (DDI) or a touch display driver IC (TDDI).

10. The electronic device of claim 1, wherein the third plate further includes a swelling hole formed in at least a partial region facing the battery.

11. The electronic device of claim 1, wherein the printed circuit board is disposed between the third plate and the second display in the second space.

12. An electronic device comprising:
a housing including a front plate, a rear plate facing a direction opposite the front plate, and a side frame surrounding a space between the front plate and the rear plate and including a support extending toward the space;
a printed circuit board disposed in the space;
a first display disposed between the support and the front plate and viewable through at least a part of the front plate;
a battery disposed in the space; and
a second display disposed between the battery and the rear plate and viewable through at least a part of the rear plate,
wherein at least a part of the second display is disposed to face the battery, and wherein at least a portion of the battery is located between at least the first display and the second display.

13. The electronic device of claim 12, wherein the first display includes:
a flat portion;
a bendable portion bendable from the flat portion toward a rear surface of the second display and including a control circuit; and
a first flexible printed circuit board (FPCB) electrically connected to the bendable portion on a rear surface of the first display, electrically connected to the printed circuit board, and having a first device arrangement area in which a plurality of devices are mounted,
wherein when the first display is viewed from above, the first device arrangement area is disposed to not overlap the battery.

14. The electronic device of claim 13, wherein the control circuit includes a display driver IC (DDI) or a touch display driver IC (TDDI).

15. The electronic device of claim 13, wherein the support includes a recess accommodating the first device arrangement area.

* * * * *